(12) United States Patent
Jung et al.

(10) Patent No.: US 11,659,744 B2
(45) Date of Patent: May 23, 2023

(54) DISPLAY PANEL AND DISPLAY APPARATUS INCLUDING THE SAME

(71) Applicant: Samsung Display Co., Ltd., Yongin-si (KR)

(72) Inventors: Sunyoung Jung, Yongin-si (KR); Gunhee Kim, Yongin-si (KR); Hyunho Kim, Yongin-si (KR); Donghwan Shim, Yongin-si (KR); Taehoon Yang, Yongin-si (KR); Sanghee Jang, Yongin-si (KR); Chungsock Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/305,503

(22) Filed: Jul. 8, 2021

(65) Prior Publication Data

US 2022/0109040 A1   Apr. 7, 2022

(30) Foreign Application Priority Data

Oct. 6, 2020 (KR) .......................... 10-2020-0128901

(51) Int. Cl.
  *H01L 27/32* (2006.01)
  *G09G 3/3225* (2016.01)
(52) U.S. Cl.
  CPC ....... *H01L 27/3276* (2013.01); *G09G 3/3225* (2013.01)

(58) Field of Classification Search
  CPC ................ G09G 3/3225; G09G 3/3258; H01L 27/3234; H01L 27/3258; H01L 27/3276
  See application file for complete search history.

(56) References Cited

U.S. PATENT DOCUMENTS

| 10,707,281 | B2 * | 7/2020 | Kuo ....................... G06F 1/1686 |
| 10,713,989 | B2 * | 7/2020 | Chen ........................ G09G 3/20 |
| 10,984,723 | B1 * | 4/2021 | Zhou ..................... G09G 3/3258 |
| 2018/0366586 | A1 | 12/2018 | Son et al. |

(Continued)

FOREIGN PATENT DOCUMENTS

| CN | 110047897 A | 7/2019 |
| CN | 110767141 A | 2/2020 |

(Continued)

*Primary Examiner* — Sardis F Azongha
(74) *Attorney, Agent, or Firm* — Lewis Roca Rothgerber Christie

(57) ABSTRACT

A display panel includes: a display area including a main display area, and a component area; a peripheral area; a plurality of main pixel circuits at the main display area; a plurality of main gate lines extending in a first direction, and connected to the main pixel circuits; a plurality of main data lines extending in a second direction, and connected to the main pixel circuits; a plurality of auxiliary display elements at the component area; a plurality of auxiliary pixel circuits at the periphery area, and connected to the auxiliary display elements; a plurality of auxiliary gate lines connected to the auxiliary pixel circuits, and to main gate lines that are adjacent to the component area in the first direction; and a plurality of auxiliary data lines connected to the auxiliary pixel circuits, and to main data lines that are adjacent to the component area in the second direction.

25 Claims, 12 Drawing Sheets

(56) References Cited

U.S. PATENT DOCUMENTS

| | | | |
|---|---|---|---|
| 2020/0098313 A1* | 3/2020 | Bian | G09G 3/3225 |
| 2021/0193758 A1* | 6/2021 | Choi | H01L 27/3248 |
| 2021/0265430 A1* | 8/2021 | Chang | H01L 27/3234 |

FOREIGN PATENT DOCUMENTS

| | | |
|---|---|---|
| CN | 110827744 A | 2/2020 |
| CN | 111063719 A | 4/2020 |
| KR | 10-2020-0037029 A | 4/2020 |

\* cited by examiner

DISPLAY PANEL AND DISPLAY APPARATUS INCLUDING THE SAME

CROSS-REFERENCE TO RELATED APPLICATION

This application claims priority to and the benefit of Korean Patent Application No. 10-2020-0128901, filed on Oct. 6, 2020, in the Korean Intellectual Property Office, the entire disclosure of which is incorporated by reference herein.

BACKGROUND

1. Field

Aspects of one or more embodiments of the present disclosure relate to a display panel, and a display apparatus including the same. More particularly, aspects of one or more embodiments of the present disclosure relate to a display panel in which a display area is extended to display an image even in an area where a component that is an electronic element is located, and a display apparatus including the display panel.

2. Description of Related Art

Display apparatuses visually display data. A display apparatus is used as a display for a small product, for example, such as a mobile phone, or is used as a display for a large product, for example, such as a television.

The display apparatus includes a substrate that is divided into a display area and a peripheral area, and a gate line and a data line are formed in the display area to be insulated from each other. A plurality of pixel regions are defined in the display area, and pixels are located in the plurality of pixel regions, respectively. The pixels receive electrical signals from the gate line and the data line that cross each other, and emit light, thereby displaying an image to the outside. A thin-film transistor and a pixel electrode electrically connected to the thin-film transistor are provided in each of the pixel regions, and a counter electrode is commonly provided over the pixel regions. Various wirings for transmitting an electrical signal to the pixels in the display area, a gate driver, and pads may be provided in the peripheral area. A data driver and a controller may be connected to the pads.

Recently, the display apparatuses have been used for various suitable purposes. Also, as the thicknesses and the weights of the display apparatuses have decreased, a range of applications of the display apparatuses has increased.

As the display apparatuses are used in various suitable ways, there may be various methods for designing the shapes of the display apparatuses, and various suitable functions linked to or associated with the display apparatuses have increased.

The above information disclosed in this Background section is for enhancement of understanding of the background of the present disclosure, and therefore, it may contain information that does not constitute prior art.

SUMMARY

One or more embodiments of the present disclosure are directed to a display panel in which a display area is extended to display an image even at (e.g., in or on) an area where a component, which is an electronic element, is located, and a display apparatus including the display panel.

However, the embodiments presented herein are provided as examples, and do not limit the scope of the present disclosure.

Additional aspects and features will be set forth, in part, in the description which follows, and in part, will be apparent from the description, or may be learned by practicing one or more of the presented embodiments of the present disclosure.

According to one or more embodiments of the present disclosure, a display panel includes: a substrate including: a display area including a main display area, and a component area; and a peripheral area outside the display area; a plurality of main pixel circuits at the main display area; a plurality of main gate lines extending in a first direction, and connected to main pixel circuits that are in a same row as each other from among the plurality of main pixel circuits; a plurality of main data lines extending in a second direction crossing the first direction, and connected to main pixel circuits that are in a same column as each other from among the plurality of main pixel circuits; a plurality of auxiliary display elements at the component area, and located along the first direction and the second direction; a plurality of auxiliary pixel circuits at the periphery area adjacent to the main display area, the plurality of auxiliary pixel circuits being located in a same row as each other, and connected to the plurality of auxiliary display elements, respectively; a plurality of auxiliary gate lines connected to the plurality of auxiliary pixel circuits, respectively, and to main gate lines that are adjacent to the component area in the first direction from among the plurality of main gate lines; and a plurality of auxiliary data lines connected to the plurality of auxiliary pixel circuits, respectively, and to main data lines that are adjacent to the component area in the second direction from among the plurality of main data lines.

In an embodiment, the plurality of auxiliary pixel circuits may be divided into a plurality of pixel circuit groups; the plurality of auxiliary display elements may be divided into a plurality of display element groups that are connected to the plurality of pixel circuit groups, respectively; and each of the plurality of display element groups may include a set of auxiliary display elements that are located in a same column as each other from among the plurality of auxiliary display elements.

In an embodiment, auxiliary data lines that are connected to a same pixel circuit group from among the plurality of auxiliary data lines may be connected to one another.

In an embodiment, auxiliary gate lines that are connected to different pixel circuit groups from each other from among the plurality of auxiliary gate lines may be connected to one another.

In an embodiment, a number of the auxiliary pixel circuits included in each of the plurality of pixel circuit groups may be the same as a number of the auxiliary display elements included in each of the plurality of display element groups.

In an embodiment, the plurality of display element groups may include a first display element group including a set of auxiliary display elements that are located in an $n^{th}$ column at the component area, and a second display element group including a set of auxiliary display elements that are located in an $n+1^{th}$ column at the component area, n being a positive integer; the plurality of pixel circuit groups may include a first pixel circuit group that is connected to the first display element group, and a second pixel circuit group that is connected to the second display element group; and a distance between the first display element group and the first pixel circuit group may be less than a distance between the second display element group and the second pixel circuit group.

In an embodiment, the plurality of auxiliary pixel circuits may be divided into a plurality of pixel circuit groups; the plurality of auxiliary display elements may be divided into a plurality of display element groups that are connected to the plurality of pixel circuit groups, respectively; and each of the plurality of display element groups may include a set of auxiliary display elements that are located in a same row as each other from among the plurality of auxiliary display elements.

In an embodiment, auxiliary data lines that are connected to different pixel circuit groups from each other from among the plurality of auxiliary data lines may be connected to one another.

In an embodiment, auxiliary gate lines that are connected to a same pixel circuit group as each other from among the plurality of auxiliary gate lines may be connected to one another.

In an embodiment, the plurality of auxiliary gate lines may be connected one-to-one to the plurality of pixel circuit groups, and may be shared by the auxiliary pixel circuits that are included in each of the plurality of pixel circuit groups.

In an embodiment, the plurality of display element groups may include a first display element group including a set of auxiliary display elements that are located in an $n^{th}$ row at the component area, and a second display element group including a set of auxiliary display elements that are located in an $n+1^{th}$ row at the component area, n being a positive integer; the plurality of pixel circuit groups may include a first pixel circuit group that is connected to the first display element group, and a second pixel circuit group that is connected to the second display element group; and the first pixel circuit group may be farther from the component area than the second pixel circuit group.

In an embodiment, the display panel may further include a plurality of data connection wirings configured to connect main data lines that are adjacent to the component area from among the plurality of main data lines to the plurality of auxiliary data lines, respectively, and the plurality of data connection wirings may be located at the main display area, and may bypass the component area.

In an embodiment, each of the plurality of data connection wirings may have a shape that is bent at least one time.

In an embodiment, the display panel may further include: a plurality of gate driving circuits at a side portion of the peripheral area, and connected to the plurality of main gate lines, respectively; and a plurality of gate connection wirings connected to gate driving circuits from among the plurality of gate driving circuits that are connected to main gate lines from among the plurality of main gate lines that are adjacent to the component area in the first direction.

In an embodiment, the plurality of main gate lines may extend from the plurality of gate driving circuits, respectively, to the main display area, and the plurality of gate connection wirings may extend from the plurality of gate driving circuits, respectively, to the peripheral area.

In an embodiment, the display panel may further include a plurality of electrode connection wirings configured to connect the plurality of auxiliary display elements to the plurality of auxiliary pixel circuits, respectively, and the plurality of electrode connection wirings may include a first electrode connection wiring and a second electrode connection wiring including different materials from each other.

In an embodiment, the first electrode connection wiring and the second electrode connection wiring may be located at a same layer as each other, and an end of the second electrode connection wiring may cover an end of the first electrode connection wiring.

In an embodiment, a distance between adjacent auxiliary display elements from among the plurality of auxiliary display elements may be constant.

In an embodiment, the display panel may further include a plurality of main display elements at the main display area, and connected to the plurality of main pixel circuits, respectively, and an emission area of a main display element from among the plurality of main display elements that is configured to emit light of a first color may be smaller than an emission area of an auxiliary display element from among the plurality of auxiliary display elements that is configured to emit light of the first color.

According to one or more embodiments of the present disclosure, a display apparatus includes: a display panel including: a display area including a main display area, and a component area; and a peripheral area outside the display area; and a component under the display panel to correspond to the component area. The display panel further includes: a substrate; a plurality of main pixel circuits at the main display area; a plurality of main gate lines extending in a first direction, and connected to main pixel circuits that are located in a same row as each other from among the plurality of main pixel circuits; a plurality of main data lines extending in a second direction crossing the first direction, and connected to main pixel circuits that are located in a same column as each other from among the plurality of main pixel circuits; a plurality of auxiliary display elements at the component area along the first direction and the second direction; a plurality of auxiliary pixel circuits at the peripheral area adjacent to the main display area in a same row as each other, and connected to the plurality of auxiliary display elements, respectively; a plurality of auxiliary gate lines connected to the plurality of auxiliary pixel circuits, respectively, and to main gate lines from among the plurality of main gate lines that are adjacent to the component area in the first direction; and a plurality of auxiliary data lines connected to the plurality of auxiliary pixel circuits, respectively, and to main data lines from among the plurality of main data lines that are adjacent to the component area in the second direction.

In an embodiment, the plurality of auxiliary pixel circuits may be divided into a plurality of pixel circuit groups; the plurality of auxiliary display elements may be divided into a plurality of display element groups that are connected to the plurality of pixel circuit groups, respectively; and each of the plurality of display element groups may include a set of auxiliary display elements from among the plurality of auxiliary display elements that are located in a same column or a same row as each other.

In an embodiment, each of the plurality of display element groups may include a set of auxiliary display elements from among the plurality of auxiliary display elements that are located in the same column as each other; auxiliary data lines from among the plurality of auxiliary data lines that are connected to a same pixel circuit group as each other may be connected to one another; and auxiliary gate lines from among the plurality of auxiliary gate lines that are connected to different pixel circuit groups from each other may be connected to one another.

In an embodiment, each of the plurality of display element groups may include a set of auxiliary display elements from among the plurality of auxiliary display elements that are located in the same row as each other; auxiliary data lines from among the plurality of auxiliary data lines that are connected to different pixel circuit groups from each other may be connected to one another; and auxiliary gate lines from among the plurality of auxiliary gate lines that are connected to a same pixel circuit group as each other may be connected to one another.

In an embodiment, the display apparatus may further include a plurality of electrode connection wirings configured to connect the plurality of auxiliary display elements to the plurality of auxiliary pixel circuits, respectively, and the plurality of electrode connection wirings may include a first electrode connection wiring, and a second electrode connection wiring that include different materials from each other.

In an embodiment, the second electrode connection wiring may overlap with the component area, and may include a transparent conductive oxide.

Other aspects and features of the present disclosure will become more apparent from the detailed description, the drawings, and the claims and their equivalents.

BRIEF DESCRIPTION OF THE DRAWINGS

The above and other aspects and features of the present disclosure will become more apparent to those skilled in the art from the following detailed description of the example embodiments with reference to the accompanying drawings, in which.

DETAILED DESCRIPTION

Figure 1:
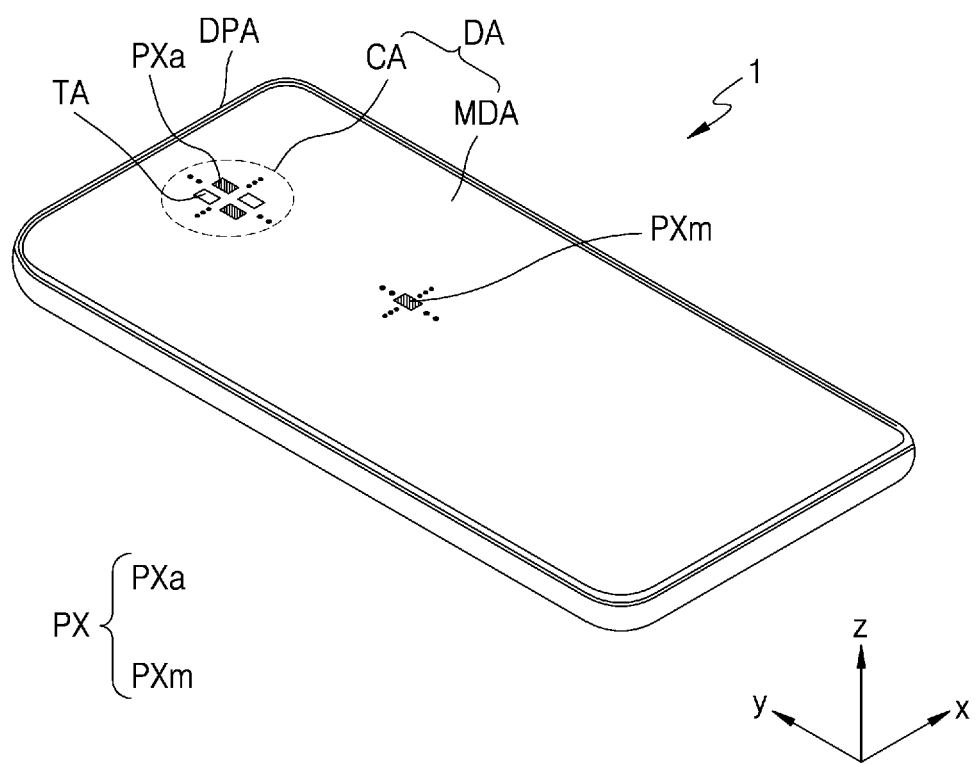
FIG. 1 is a perspective view of a display apparatus according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

When a certain embodiment may be implemented differently, a specific process order may be different from that of the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The x-axis, the y-axis, and the z-axis shown in the figures are not limited to three axes of the rectangular coordinate system, and may be interpreted in a broader sense. For example, the x-axis, the y-axis, and the z-axis may be perpendicular to or substantially perpendicular to one another, or may represent different directions that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when layers, areas, or elements are referred to as being "electrically connected" to another layer, area, or element, they may be directly electrically connected to each other, and/or may be indirectly electrically connected to each other with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display apparatus 1 according to an embodiment.

Referring to FIG. 1, the display apparatus 1 may include a display area DA, and a peripheral area DPA outside the display area DA. The display area DA may include a component area CA, and a main display area MDA at least partially surrounding (e.g., around a periphery of) the component area CA. In other words, the component area CA and the main display area MDA may display an image individually or together. The peripheral area DPA may be a non-display area where display elements are not located. The display area DA may be entirely surrounded (e.g., around a periphery thereof) by the peripheral area DPA.

FIG. 1 shows that one component area CA is located inside (e.g., within) the main display area MDA as an example. In another embodiment, the display apparatus 1 may include two or more component areas CA, and the shapes and/or sizes of the plurality of component areas CA may be the same or substantially the same as or different from one another. When viewed in a direction that is perpendicular to or substantially perpendicular to a top surface of the display apparatus 1 (e.g., in a plan view), the component area CA may have any of various suitable shapes, for example, such as a polygonal shape (e.g., a quadrangular shape, a star shape, a diamond shape, or the like), a circular shape, an elliptical shape, or the like. Although FIG. 1 shows that the component area CA is located at the center of an upper portion (e.g., in the +y direction) of the main display area MDA having a quadrangular or substantially quadrangular shape when viewed in the direction that is perpendicular to or substantially perpendicular to the top surface of the display apparatus 1 (e.g., in the plan view), the present disclosure is not limited thereto, and the component area CA may be located at (e.g., in or on) a side portion of the main display area MDA having the quadrangular shape, for example, such as at (e.g., in or on) an upper right portion or an upper left portion of the main display area MDA.

The display apparatus 1 may provide an image by using a plurality of pixels PX located at (e.g., in or on) the display area DA. The plurality of pixels PX may include a plurality of main pixels PXm, and a plurality of auxiliary pixels PXa. The display apparatus 1 may provide an image by using the plurality of main pixels PXm, which are located at (e.g., in or on) the main display area MDA, and the plurality of auxiliary pixels PXa, which are located at (e.g., in or on) the component area CA. Each of the plurality of main pixels PXm and the plurality of auxiliary pixels PXa may include a display element. For example, each of the plurality of main pixels PXm and the plurality of auxiliary pixels PXa may include, for example, an organic light-emitting diode (OLED) as the display element. Each pixel PX may emit a suitable colored light through the OLED, for example, such as a red light, a green light, a blue light, or a white light. Hereinafter, each pixel PX refers to a sub-pixel that emits light of a different color from that of another sub-pixel, and may be any suitable one of, for example, a red sub-pixel, a green sub-pixel, or a blue sub-pixel.

At (e.g., in or on) the component area CA, a component 40 that is an electronic element may be located under (e.g., underneath) a display panel to correspond to the component area CA, as described in more detail below with reference to FIG. 2. For example, the component 40 may include a camera that uses infrared light or visible light, and may include an image pickup device. As another example, the component 40 may include a solar cell, a flash, an illuminance sensor, a proximity sensor, or an iris sensor. As another example, the component 40 may have a function of receiving sound. In order to reduce or minimize a limitation of a function of the component 40, the component area CA may include a transmissive area TA through which light and/or sound output from the component 40 to the outside or traveling from the outside toward the component 40 may be transmitted. In the case of the display panel and the display apparatus 1 including the display panel according to an embodiment, when light is transmitted through the component area CA, a light transmittance thereof (e.g., of the transmissive area TA) may be equal to or substantially equal to, or greater than, about 10%, for example, such as equal to or substantially equal to, or greater than, about 40%, about 25%, about 50%, about 85%, or about 90% according to various embodiments.

The plurality of auxiliary pixels PXa may be located at (e.g., in or on) the component area CA. The plurality of auxiliary pixels PXa may emit light to provide a suitable image (e.g., a predetermined or certain image). An image displayed at (e.g., in or on) the component area CA, which is an auxiliary image, may have a resolution that is lower than that of an image displayed at (e.g., in or on) the main display area MDA. In other words, the component area CA may include the transmissive area TA through which light and/or sound may be transmitted, and when a pixel is not located at (e.g., in or on) the transmissive area TA, the number of auxiliary pixels PXa that may be located per unit area at (e.g., in or on) the component area CA may be less than the number of main pixels PXm located per the same sized unit area at (e.g., in or on) the main display area MDA.

Figure 2:
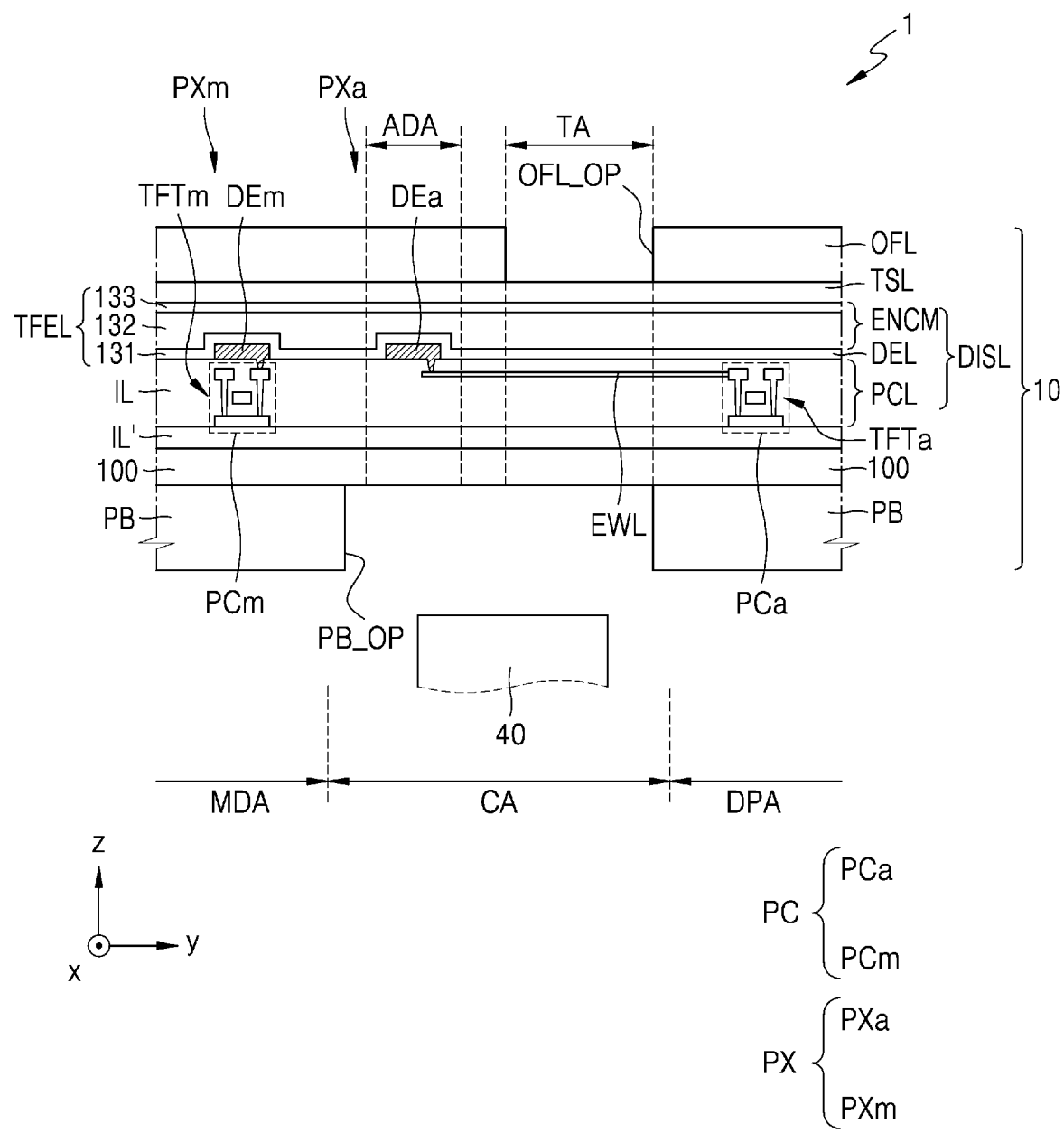
FIG. 2 is a cross-sectional view illustrating a part of the display apparatus according to an embodiment.

FIG. 2 is a cross-sectional view illustrating a part of the display apparatus 1 according to an embodiment.

Referring to FIG. 2, the display apparatus 1 may include a display panel 10, and the component 40 overlapping with the display panel 10. A cover window that protects the display panel 10 may be further located on the display panel 10.

The display panel 10 includes the component area CA that is an area overlapping with the component 40, and the main display area MDA where a main image is displayed. The display panel 10 may include a substrate 100, a display layer DISL, a touchscreen layer TSL, an optical functional layer OFL, and a panel protection member PB. The display layer DISL, the touchscreen layer TSL, and the optical functional layer OFL may be located over the substrate 100. The panel protection member PB may be located under (e.g., underneath) the substrate 100.

The display layer DISL may include a circuit layer PCL including main and auxiliary thin-film transistors TFTm and TFTa, a display element layer DEL including main and auxiliary display elements DEm and DEa, and a sealing member ENCM, for example, such as a thin-film encapsulation layer TFEL or a sealing substrate. Insulating layers IL and IL' may be located between the substrate 100 and the display layer DISL, and in the display layer DISL.

The substrate 100 may be formed of an insulating material, for example, such as glass, quartz, or a polymer resin. The substrate 100 may be a rigid substrate, or a flexible substrate that is bendable, foldable, and/or rollable.

A main pixel circuit PCm, and the main display element DEm connected to the main pixel circuit PCm may be located at (e.g., in or on) the main display area MDA of the display panel 10. The main pixel circuit PCm may include at least one main thin-film transistor TFTm, and may control a light emission of the main display element DEm. The main pixel PXm may be implemented by the light emission of the main display element DEm.

The auxiliary display element DEa may be located at (e.g., in or on) the component area CA of the display panel 10 to implement the auxiliary pixel PXa. In the present embodiment, an auxiliary pixel circuit PCa for driving the auxiliary display element DEa may not be located at (e.g., in or on) the component area CA, and may be located at (e.g., in or on) the peripheral area DPA that is a non-display area. However, the present disclosure is not limited thereto, and various suitable modifications may be made. For example, in another embodiment, the auxiliary pixel circuit PCa may be located at (e.g., in or on) a portion of the main display area MDA, or the auxiliary pixel circuit PCa may be located between the main display area MDA and the component area CA. In other words, the auxiliary pixel circuit PCa may not overlap with the auxiliary display element DEa.

The auxiliary pixel circuit PCa may include at least one auxiliary thin-film transistor TFTa, and may be electrically connected to the auxiliary display element DEa by an electrode connection wiring EWL. The electrode connection wiring EWL may be formed of a transparent conductive material. The auxiliary pixel circuit PCa may control a light emission of the auxiliary display element DEa. The auxiliary pixel PXa may be implemented by the light emission of the auxiliary display element DEa. A portion of the component area CA where the auxiliary display element DEa is located may be referred to as an auxiliary display area ADA.

A portion of the component area CA where the auxiliary display element DEa is not located may be referred to as the transmissive area TA. The transmissive area TA may be an area through which light and/or a signal emitted from the component located to correspond to the component area CA is transmitted, and/or an area through which light and/or a signal incident on the component area 40 is transmitted. The auxiliary display area ADA and the transmissive area TA may be alternately located (e.g., alternately arranged) at (e.g., in or on) the component area CA. The electrode connection wiring EWL that connects the auxiliary pixel circuit PCa to the auxiliary display element DEa may be located at (e.g., in or on) the transmissive area TA. Because the electrode connection wiring EWL may be formed of a transparent conductive material having a high transmittance, even though the electrode connection wiring EWL is located at (e.g., in or on) the transmissive area TA, a transmittance of the transmissive area TA may be ensured.

In the present embodiment, because the auxiliary pixel circuit PCa is not located at (e.g., in or on) the component area CA, the area of the transmissive area TA may be secured, and thus, a light transmittance thereof may be further increased.

The display element layer DEL may be covered by the thin-film encapsulation layer TFEL, or by a sealing substrate. In some embodiments, the thin-film encapsulation layer TFEL may include at least one inorganic encapsulation layer and at least one organic encapsulation layer, for example, as shown in FIG. 2. For example, as shown in FIG. 2, in an embodiment, the thin-film encapsulation layer TFEL may include a first inorganic encapsulation layer 131, a second inorganic encapsulation layer 133, and an organic encapsulation layer 132 between the first inorganic encapsulation layer 131 and the second inorganic encapsulation layer 133.

Each of the first inorganic encapsulation layer 131 and the second inorganic encapsulation layer 133 may include at least one inorganic insulating material, for example, such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$), and may be formed by using chemical vapor deposition (CVD) or the like. The organic encapsulation layer 132 may include a polymer-based material. Examples of the polymer-based material may include silicon-based resin, acrylic resin, epoxy resin, polyimide, and/or polyethylene.

The first inorganic encapsulation layer 131, the organic encapsulation layer 132, and the second inorganic encapsulation layer 133 may be integrally formed to cover the main display area MDA and the component area CA.

When the display element layer DEL is sealed with a sealing substrate instead of the thin-film encapsulation layer TFEL shown in FIG. 2, the sealing substrate may face the substrate 100 with the display element layer DEL therebetween. The sealing substrate may include glass. There may be a gap between the sealing substrate and the display element layer DEL. A sealant, for example, such as a frit or the like, may be located between the substrate 100 and the sealing substrate, and may be located at (e.g., in or on) the peripheral area DPA. The sealant located at (e.g., in or on) the peripheral area DPA may surround (e.g., around a periphery of) the display area DA, and may prevent or substantially prevent moisture from penetrating through a side surface.

The touchscreen layer TSL may obtain coordinate information according to an external input, for example, such as a touch event. The touchscreen layer TSL may include a touch electrode, and touch wirings connected to the touch electrode. The touchscreen layer TSL may detect the external input by using a self-capacitive method or a mutual capacitive method.

The touchscreen layer TSL may be formed on the thin-film encapsulation layer TFEL. As another example, the touchscreen layer TSL may be separately formed on a touch substrate, and then may be attached to (e.g., may be adhered to) the thin-film encapsulation layer TFEL through an adhesive layer, for example, such as an optically clear adhesive (OCA). In an embodiment, the touchscreen layer TSL may be formed directly on the thin-film encapsulation layer TFEL, and in this case, the adhesive layer may not be located between the touchscreen layer TSL and the thin-film encapsulation layer TFEL.

The optical functional layer OFL may include an anti-reflection layer. The anti-reflection layer may reduce a reflectance of light (e.g., external light) that is incident on the display apparatus 1.

In some embodiments, the optical functional layer OFL may include (e.g., may be) a polarizing film. The optical functional layer OFL may have an opening OFL_OP corresponding to (e.g., overlapping with) the transmissive area TA. Accordingly, a light transmittance of the transmissive area TA may be increased (e.g., may be significantly increased). A transparent material, for example, such as an optically clear resin (OCR) may be filled in the opening OFL_OP.

In some embodiments, the optical functional layer OFL may include (e.g., may be provided as) a filter plate including a black matrix and color filters.

The panel protection member PB may be attached to the bottom of the substrate 100, and may support and protect the substrate 100. The panel protection member PB may have an opening PB_OP corresponding to (e.g., overlapping with) the component area CA. Because the panel protection member PB has the opening PB_OP, a light transmittance of the component area CA may be increased. The panel protection member PB may include polyethylene terephthalate (PET) or polyimide (PI).

The component area CA may be larger than an area where the component 40 is located. Accordingly, an area (e.g., a size or a width) of the opening PB_OP of the panel protection member PB may not be the same as an area (e.g., a size or a width) of the component area CA.

In some embodiments, a plurality of components 40 may be located at (e.g., in or on) the component area CA. The plurality of components 40 may have different functions from each other. For example, the plurality of components 40 may include at least two of a camera (e.g., an image pickup device), a solar cell, a flash, a proximity sensor, an illuminance sensor, and/or an iris sensor.

In some embodiments, a bottom metal layer BML may be further located under (e.g., underneath) the auxiliary display element DEa of the component area CA. In other words, the display apparatus 1 may include the bottom metal layer BML.

The bottom metal layer BML may be located between the substrate 100 and the auxiliary display element DEa to overlap with the auxiliary display element DEa. The bottom metal layer BML may block or substantially block external light from reaching the auxiliary display element DEa. The bottom metal layer BML may be formed to correspond to the entire component area CA, and may have a bottom hole corresponding to the transmissive area TA. In this case, the bottom hole may have any of various suitable shapes, for example, such as a polygonal shape, a circular shape, or an irregular shape, to adjust external light diffraction characteristics.

Figure 3:
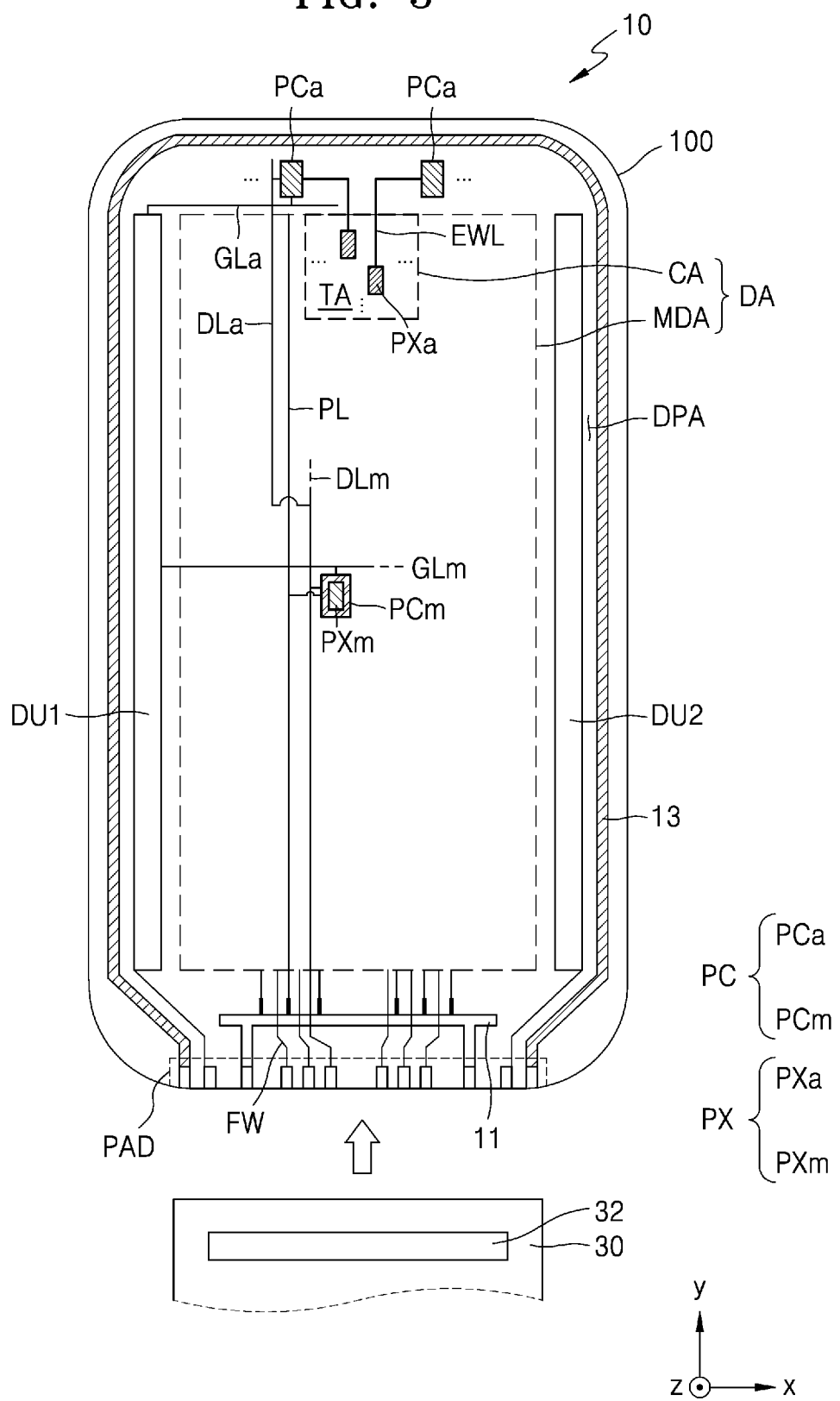
FIG. 3 is a plan view of a display panel that may be included in the display apparatus according to an embodiment.

FIG. 3 is a plan view illustrating the display panel 10 that may be included in the display apparatus 1 according to an embodiment.

Referring to FIG. 3, various elements of the display panel 10 may be located on the substrate 100. The substrate 100 may include the display area DA, and the peripheral area DPA surrounding (e.g., around a periphery of) the display area DA. The display area DA may include the main display area MDA where a main image is displayed, and the component area CA where an auxiliary image is displayed. The component area CA includes the transmissive area TA. The auxiliary image may form one whole image together with the main image, or may be an image independent of the main image.

A plurality of main pixels PXm are located at (e.g., in or on) the main display area MDA. Each of the main pixels PXm may be implemented by a display element, for example, such as an organic light-emitting diode (OLED). The main pixel circuit PCm for driving the main pixel PXm may be located at (e.g., in or on) the main display area MDA, and may overlap with the main pixel PXm. Each main pixel PXm may emit a suitable colored light, for example, such as a red light, a green light, a blue light, or a white light. The main display area MDA may be covered by a sealing member, and may be protected from external air and/or moisture.

The component area CA may be located on a side portion (e.g., an end or an edge) of the main display area MDA as described above, or may be located inside (e.g., within) the display area DA to be surrounded (e.g., around a periphery thereof) by the main display area MDA. A plurality of auxiliary pixels PXa are located at (e.g., in or on) the component area CA. Each of the plurality of auxiliary pixels PXa may be implemented by a display element, for example, such as an organic light-emitting diode (OLED). The auxiliary pixel circuit PCa for driving the auxiliary pixel PXa may be located at (e.g., in or on) a region of the peripheral area DPA that is adjacent to (e.g., close to) the component area CA. For example, when the component area CA is located at (e.g., in or on) an upper portion of the display area DA, the auxiliary pixel circuit PCa may be located at (e.g., in or on) an upper portion of the peripheral area DPA. The auxiliary pixel circuit PCa may be located at (e.g., in or on) the peripheral area DPA adjacent to the main display area MDA. The display element used to implement the auxiliary pixel PXa may be connected to the auxiliary pixel circuit PCa by the electrode connection wiring EWL. A portion of the electrode connection wiring EWL may extend in the y-direction, and another portion of the electrode connection wiring EWL may extend in the x-direction.

Each auxiliary pixel PXa may emit light of a suitable color, for example, such as a red light, a green light, a blue light, or a white light. The component area CA may be covered by the sealing member, and may be protected from external air and/or moisture.

The component area CA may include the transmissive area TA. For example, the transmissive area TA may surround (e.g., around a periphery of) a plurality of auxiliary pixels PXa. As another example, a plurality of the transmissive areas TA and the plurality of auxiliary pixels PXa may be arranged in a lattice pattern.

Because the component area CA includes the transmissive area TA, a resolution of the component area CA may be lower than a resolution of the main display area MDA. For example, the resolution of the component area CA may be about ½, ⅜, ⅓, ¼, ⅔, ⅛, ⅑, 1/12.25, or 1/16 of the resolution of the main display area MDA. For example, the resolution of the main display area MDA may be about 400 ppi or more, and the resolution of the component area CA may be about 200 ppi or about 100 ppi.

The pixel circuits PC for driving the pixels PX may be electrically connected to outer circuits located at (e.g., in or on) the peripheral area DPA. For example, a first driver DU1, a second driver DU2, a pad unit (e.g., a pad area or a pad terminal) PAD, a driving voltage supply line 11, and a common voltage supply line 13 may be located at (e.g., in or on) the peripheral area DPA.

The first driver DU1 may include a plurality of gate driving circuits. Each gate driving circuit may be connected to a corresponding main gate line GLm and/or a corresponding auxiliary gate line GLa extending in the x-direction. The main gate line GLm may be connected to the main pixel circuits PCm that are located in the same row as each other, and an electrical signal may be sequentially transmitted to the main pixels PXm located in the same row as each other through the main gate line GLm. The auxiliary gate line GLa may be connected to the auxiliary pixel circuits PCa, and an electrical signal may be transmitted to the auxiliary pixels PXa connected to the auxiliary pixel circuits PCa through the auxiliary gate line GLa. Although the auxiliary pixel circuit PCa that is located on the left side of FIG. 3 is described in more detail, the same or substantially the same description may be applied to the auxiliary pixel circuit PCa that is located on the right side of FIG. 3.

Although each of the main gate line GLm and the auxiliary gate line GLa includes one wiring in FIG. 3, the present disclosure is not limited thereto, and each of the man gate line GLm and the auxiliary gate line GLa may include a plurality of wirings. The main gate line GLm may include a main scan line and a main emission control line, and the auxiliary gate line GLa may include an auxiliary scan line and an auxiliary emission control line.

Each of the plurality of gate driving circuits may include a scan driving circuit and an emission control driving circuit. The scan driving circuits included in the gate driving circuits may apply a scan signal to each main pixel PXm through the main scan line, and may apply a scan signal to each auxiliary pixel PXa through the auxiliary scan line. Also, the emission control driving circuits included in the gate driving circuits may apply an emission control signal to each main pixel PXm through the main emission control line, and may apply an emission control signal to each auxiliary pixel PXa through the auxiliary emission control line.

The second driver DU2 may be located to be parallel to or substantially parallel to the first driver DU1 with the display area DA therebetween. The pixels PX located at (e.g., in or on) the display area DA may be commonly connected to the first driver DU1 and the second driver DU2. In another embodiment, some of the pixels PX located at (e.g., in or on) the display area DA may be electrically connected to the first driver DU1, and others of the pixels PX may be connected to the second driver DU2. In another embodiment, the second driver DU2 may be omitted as needed or desired.

The pad unit PAD may be located on a side portion (e.g., on an end) of the substrate 100. The pad unit PAD may be exposed without being covered by an insulating layer, and may be connected to a display circuit board 30. A display driver 32 may be located on the display circuit board 30.

The display driver 32 may generate a control signal that is transmitted to the first driver DU1 and the second driver DU2. The display driver 32 may generate a data signal, and the generated data signal may be transmitted to the main pixel circuits PCm through a fan-out wiring FW and a main data line DLm connected to the fan-out wiring FW. The generated data signal may also be transmitted to the auxiliary pixel circuits PCa through an auxiliary data line DLa connected to the main data line DLm. The auxiliary data line DLa may be connected to the main data line DLm through a data connection wiring, which will be described in more detail below.

The display driver 32 may supply a driving voltage ELVDD to the driving voltage supply line 11, and may supply a common voltage ELVSS to the common voltage supply line 13. The driving voltage ELVDD may be applied to the pixel circuit PC of the pixels PX through a driving voltage line PL connected to the driving voltage supply line 11, and the common voltage ELVSS may be applied to a counter electrode of a display element connected to the common voltage supply line 13.

The driving voltage supply line 11 may located below the main display area MDA, and may extend in the x-direction. The common voltage supply line 13 may have a loop shape with an open side, and may partially surround (e.g., around a periphery of) the main display area MDA.

Although one component area CA is illustrated in FIG. 3, a plurality of component areas CA may be provided. In this case, the plurality of component areas CA may be spaced apart from one another. A first camera may be located to correspond to one component area CA, and a second camera may be located to correspond to another component area CA. As another example, a camera may be located to correspond to one component area CA, and an infrared sensor may be located to correspond to another component area CA. The shapes and/or the sizes of the plurality of component areas CA may be different from one another.

Each component area CA may have a circular shape, an elliptical shape, a polygonal shape, or an irregular shape. In some embodiments, the component area CA may have an octagonal shape. The component area CA may have any of various suitable polygonal shapes, for example, such as a quadrangular shape or a hexagonal shape. The component area CA may be surrounded (e.g., around a periphery thereof) by the main display area MDA.

Figure 4:
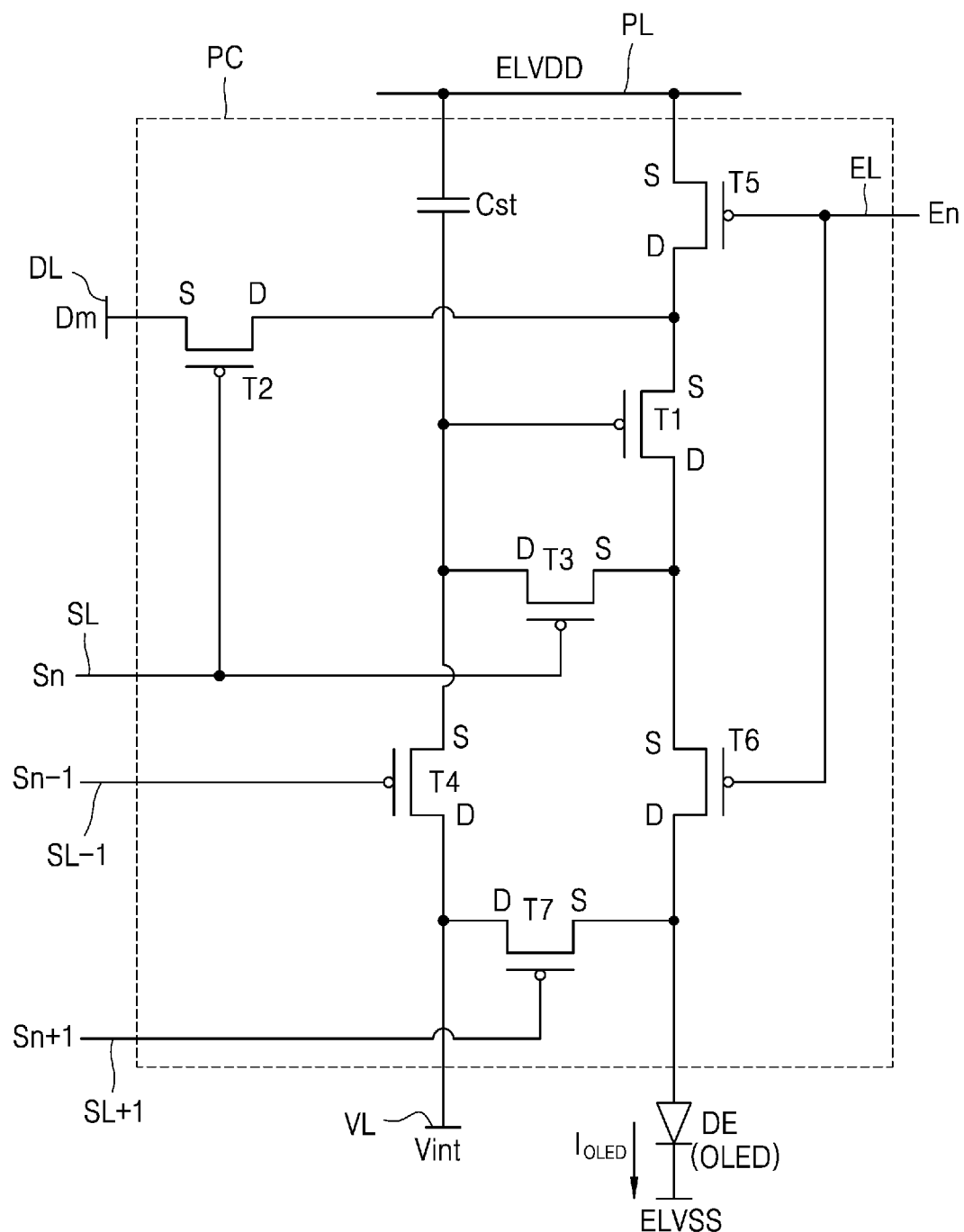
FIG. 4 is an equivalent circuit diagram illustrating a pixel circuit that may be applied to the display panel according to an embodiment.

FIG. 4 is an equivalent circuit diagram illustrating the pixel circuit PC that may be applied to the display panel 10 according to an embodiment.

Referring to FIG. 4, the pixel circuit PC may be connected to a scan line SL, a data line DL, and a display element DE. The display element DE may be an organic light-emitting diode (OLED).

For example, as shown in FIG. 4, the pixel circuit PC may include first through seventh thin-film transistors T1 through T7, and a storage capacitor Cst. The first through seventh thin-film transistors T1 through T7 and the storage capacitor Cst are connected to first through third scan lines SL, SL−1, and SL+1 that transmit first through third scan signals Sn, Sn−1, and Sn+1, respectively, the data line DL that transmits a data voltage Dm, an emission control line EL that transmits an emission control signal En, the driving voltage line PL that transmits the driving voltage ELVDD, an initialization voltage line VL that transmits an initialization voltage Vint, and the display element DE including a common electrode to which the common voltage ELVSS is applied.

The first thin-film transistor T1 may be a driving transistor in which an amount of a drain current is determined according to a gate-source voltage thereof, and the second through seventh thin-film transistors T2 through T7 may be switching transistors that are turned on/off according to a gate-source voltage thereof, or in other words, according to or substantially according to a gate voltage thereof.

The first thin-film transistor T1 may be referred to as a driving thin-film transistor, the second thin-film transistor T2 may be referred to as a scan thin-film transistor, the third thin-film transistor T3 may be referred to as a compensation thin-film transistor, the fourth thin-film transistor T7 may be referred to as a gate initialization thin-film transistor, the fifth thin-film transistor T5 may be referred to as a first emission control thin-film transistor, the sixth thin-film transistor T6 may be referred to as a second emission control thin-film transistor, and the seventh thin-film transistor T7 may be referred to as an anode initialization thin-film transistor.

The storage capacitor Cst is connected between the driving voltage line PL and a driving gate of the driving thin-film transistor T1. The storage capacitor Cst may include an upper electrode connected to the driving voltage line PL, and a lower electrode connected to the driving gate of the driving thin-film transistor T1.

The driving thin-film transistor T1 may control the amount of driving current $I_{OLED}$ flowing from the driving voltage line PL to the organic light-emitting diode OLED according to a gate-source voltage. The driving thin-film transistor T1 may include the driving gate connected to the lower electrode of the storage capacitor Cst, a driving source connected to the driving voltage line PL through the first emission control thin-film transistor T5, and a driving drain connected to the organic light-emitting diode OLED through the second emission control thin-film transistor T6.

The driving thin-film transistor T1 may output the driving current $I_{OLED}$ to the organic light-emitting diode OLED according to the gate-source voltage. The amount of the driving current $I_{OLED}$ is determined based on a difference between the gate-source voltage of the driving thin-film transistor T1 and a threshold voltage thereof. The organic light-emitting diode OLED may receive the driving current $I_{OLED}$ from the driving thin-film transistor T1, and may emit light having a luminance according to the amount of the driving current $I_{OLED}$.

The scan thin-film transistor T2 transmits the data voltage Dm to the driving source of the driving thin-film transistor T1 in response to the first scan signal Sn. The scan thin-film transistor T2 may include a scan gate connected to the first scan line SL, a scan source connected to the data line DL, and a scan drain connected to the driving source of the driving thin-film transistor T1.

The compensation thin-film transistor T3 is connected in series between the driving drain and the driving gate of the driving thin-film transistor T1, and connects the driving drain to the driving gate of the driving thin-film transistor T1 in response to the first scan signal Sn to diode-connect the driving thin-film transistor T1. The compensation thin-film transistor T3 may include a compensation gate connected to the first scan line SL, a compensation source connected to the driving drain of the driving thin-film transistor T1, and a compensation drain connected to the driving gate of the driving thin-film transistor T1. Although the compensation thin-film transistor T3 is shown as including one thin-film transistor in FIG. 4, the present disclosure is not limited thereto, and the compensation thin-film transistor T3 may include two thin-film transistors that are connected in series to each other.

The gate initialization thin-film transistor T4 applies the initialization voltage Vint to the driving gate of the driving thin-film transistor T1 in response to the second scan signal Sn−1. The gate initialization thin-film transistor T4 may include a first initialization gate connected to the second scan line SL−1, a first initialization source connected to the driving gate of the driving thin-film transistor T1, and a first initialization drain connected to the initialization voltage line VL. Although the gate initialization thin-film transistor T4 is shown as including one thin-film transistor in FIG. 4, the present disclosure is not limited thereto, and the gate initialization thin-film transistor T4 may include two thin-film transistors that are connected in series to each other.

The anode initialization thin-film transistor T7 applies the initialization voltage Vint to an anode of the organic light-emitting diode OLED in response to the third scan signal Sn+1. The anode initialization thin-film transistor T7 may include a second initialization gate connected to the third scan line SL+1, a second initialization source connected to the anode of the organic light-emitting diode OLED, and a second initialization drain connected to the initialization voltage line VL.

The first emission control thin-film transistor T5 may connect the driving voltage line PL to the driving source of the driving thin-film transistor T1 in response to the emission control signal En. The first emission control thin-film transistor T5 may include a first emission control gate connected to the emission control line EL, a first emission control source connected to the driving voltage line PL, and a first emission control drain connected to the driving source of the driving thin-film transistor T1.

The second emission control thin-film transistor T6 may connect the driving drain of the driving thin-film transistor T1 to the anode of the organic light-emitting diode OLED in response to the emission control signal En. The second emission control thin-film transistor T6 may include a second emission control gate connected to the emission control line EL, a second emission control source connected to the driving drain of the driving thin-film transistor T1, and a second emission control drain connected to the anode of the organic light-emitting diode OLED.

The second scan signal Sn−1 may be synchronized or substantially synchronized with the first scan signal Sn of a previous row. The third scan signal Sn+1 may be synchronized or substantially synchronized with the first scan signal Sn. As another example, the third scan signal Sn+1 may be synchronized or substantially synchronized with the first scan signal Sn of a next row.

In the present embodiment, each of the first through seventh thin-film transistors T1 through T7 may include a semiconductor layer including silicon. For example, each of the first through seventh thin-film transistors T1 through T7 may include a semiconductor layer including a low temperature poly-silicon (LTPS). A polysilicon material has a high electron mobility (e.g., of 100 cm$^2$/Vs or more), and thus, has low energy consumption and excellent reliability. As another example, the semiconductor layers of the first through seventh thin-film transistors T1 through T7 may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). For example, a semiconductor layer A may be an InSnZnO (ITZO)

semiconductor layer or an InGaZnO (IGZO) semiconductor layer. As another example, some semiconductor layers of the first through seventh thin-film transistors T1 through T7 may be formed of a low temperature poly-silicon (LTPS), and other semiconductor layers thereof may be formed of an oxide semiconductor (e.g., IGZO).

An operation of one pixel PC of the display panel 10 and the organic light-emitting diode OLED, which is the display element DE, will now be described in more detail. In the following description, the first through seventh thin-film transistors T1 through T7 are assumed to be p-type metal-oxide-semiconductor field-effect transistors (MOSFETs) as shown in FIG. 4, and thus, the level (e.g., turn on level and turn off level) of the signals are described based on this assumption, but the present disclosure is not limited thereto.

First, when the emission control signal En having a high level is received, the first emission control thin-film transistor T5 and the second emission control thin-film transistor T6 are turned off. The driving thin-film transistor T1 stops outputting the driving current $I_{OLED}$, and the organic light-emitting diode OLED stops emitting light.

Next, during a gate initialization period in which the second scan signal Sn−1 having a low level is received, the gate initialization thin-film transistor T4 is turned on, and the initialization voltage Vint is applied to the driving gate of the driving thin-film transistor T1, or in other words, to the lower electrode of the storage capacitor Cst. A difference (e.g., ELVDD−Vint) between the driving voltage ELVDD and the initialization voltage Vint is stored in the storage capacitor Cst.

Next, during a data write period in which the first scan signal Sn having a low level is received, the scan thin-film transistor T2 and the compensation thin-film transistor T3 are turned on, and the data voltage Dm is received by the driving source of the driving thin-film transistor T1. The driving thin-film transistor T1 is diode-connected by the compensation thin-film transistor T3, and is forwardly biased. A gate voltage of the driving thin-film transistor T1 increases from the initialization voltage Vint. When the gate voltage of the driving thin-film transistor T1 is equal to or substantially equal to a data compensation voltage (e.g., Dm−|Vth|) that is obtained by subtracting a threshold voltage Vth of the driving thin-film transistor T1 from the data voltage Dm, the driving thin-film transistor T1 is turned off, and the gate voltage of the driving thin-film transistor T1 does not increase any more. Accordingly, a difference (e.g., ELVDD−Dm+|Vth|) between the driving voltage ELVDD and the data compensation voltage (e.g., Dm−|Vth|) is stored in the storage capacitor Cst.

During an anode initialization period in which the third scan signal Sn+1 having a low level is received, the anode initialization thin-film transistor T7 is turned on, and the initialization voltage Vint is applied to the anode of the organic light-emitting diode OLED so as to not emit light. Because the initialization voltage Vint is applied to the anode of the organic light-emitting diode OLED so as to not emit light, even when the pixel circuit PC receives the data voltage Dm corresponding to a black gray level in a next frame, a phenomenon in which the organic light-emitting diode OLED finely emits light may be prevented or substantially prevented.

The first scan signal Sn and the third scan signal Sn+1 may be synchronized or substantially synchronized with each other, and in this case, the data write period and the anode initialization period may be the same or substantially the same period.

Next, when the emission control signal En having a low level is received, the first emission control thin-film transistor T5 and the second emission control thin-film transistor T6 may be turned on. The driving thin-film transistor T1 may output the driving current $I_{OLED}$ corresponding to a voltage (e.g., ELVDD−Dm) obtained by subtracting the threshold voltage (|Vth|) of the driving thin-film transistor T1 from a voltage stored in the storage capacitor Cst, or in other words, a source-gate voltage (e.g., ELVDD−Dm+|Vth|) of the driving thin-film transistor T1, and the organic light-emitting diode OLED may emit light having a luminance corresponding to the amount of the driving current $I_{OLED}$.

Although the pixel circuit PC is shown in FIG. 4 as including seven thin-film transistors and one storage capacitor, the present disclosure is not limited thereto. For example, in other embodiments, the pixel circuit PC may include two thin-film transistors and one storage capacitor, or may include three or more thin-film transistors and/or two or more storage capacitors.

Figure 5:
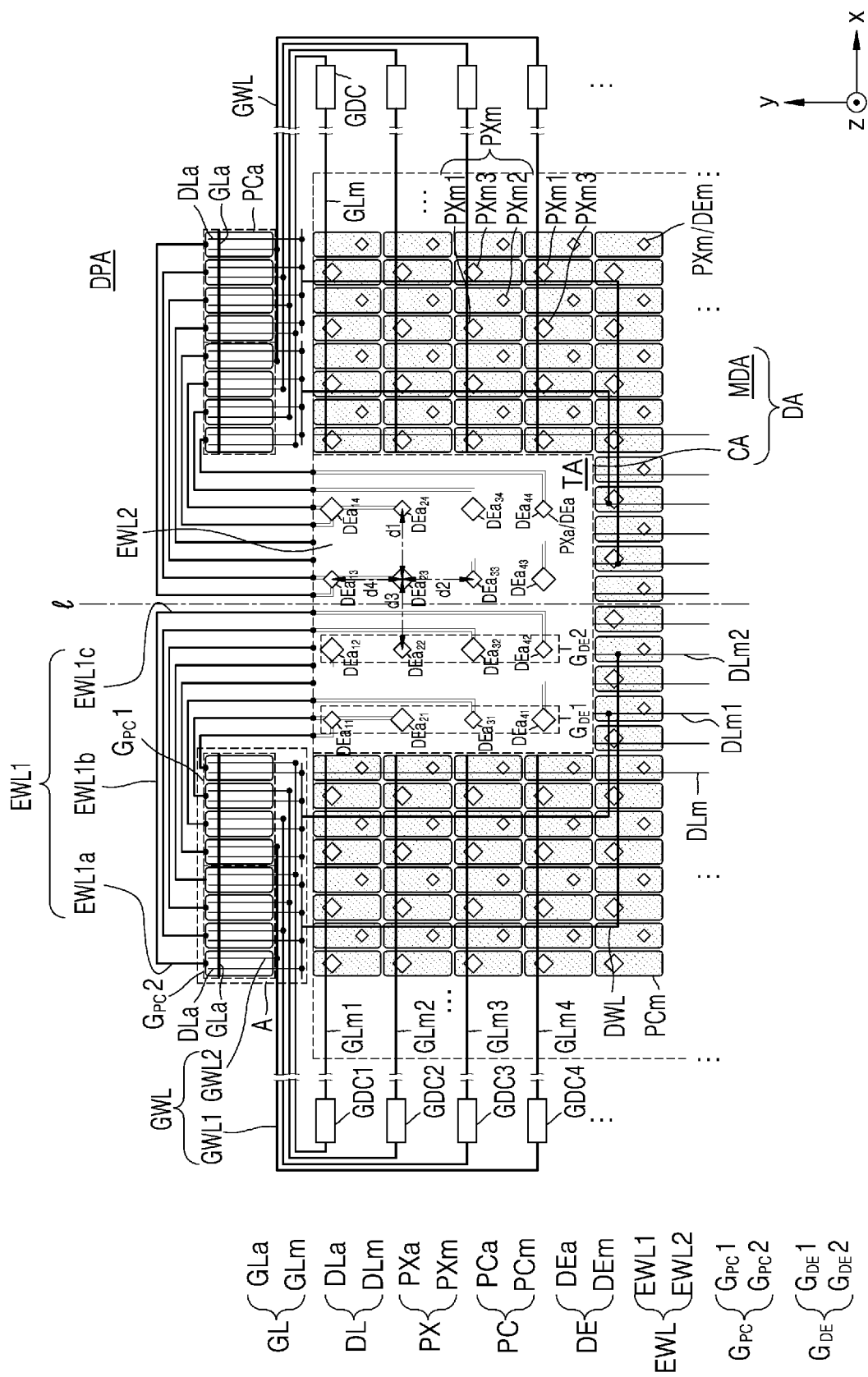
FIG. 5 is a plan view illustrating a portion of the display panel according to an embodiment.
Figure 6A:
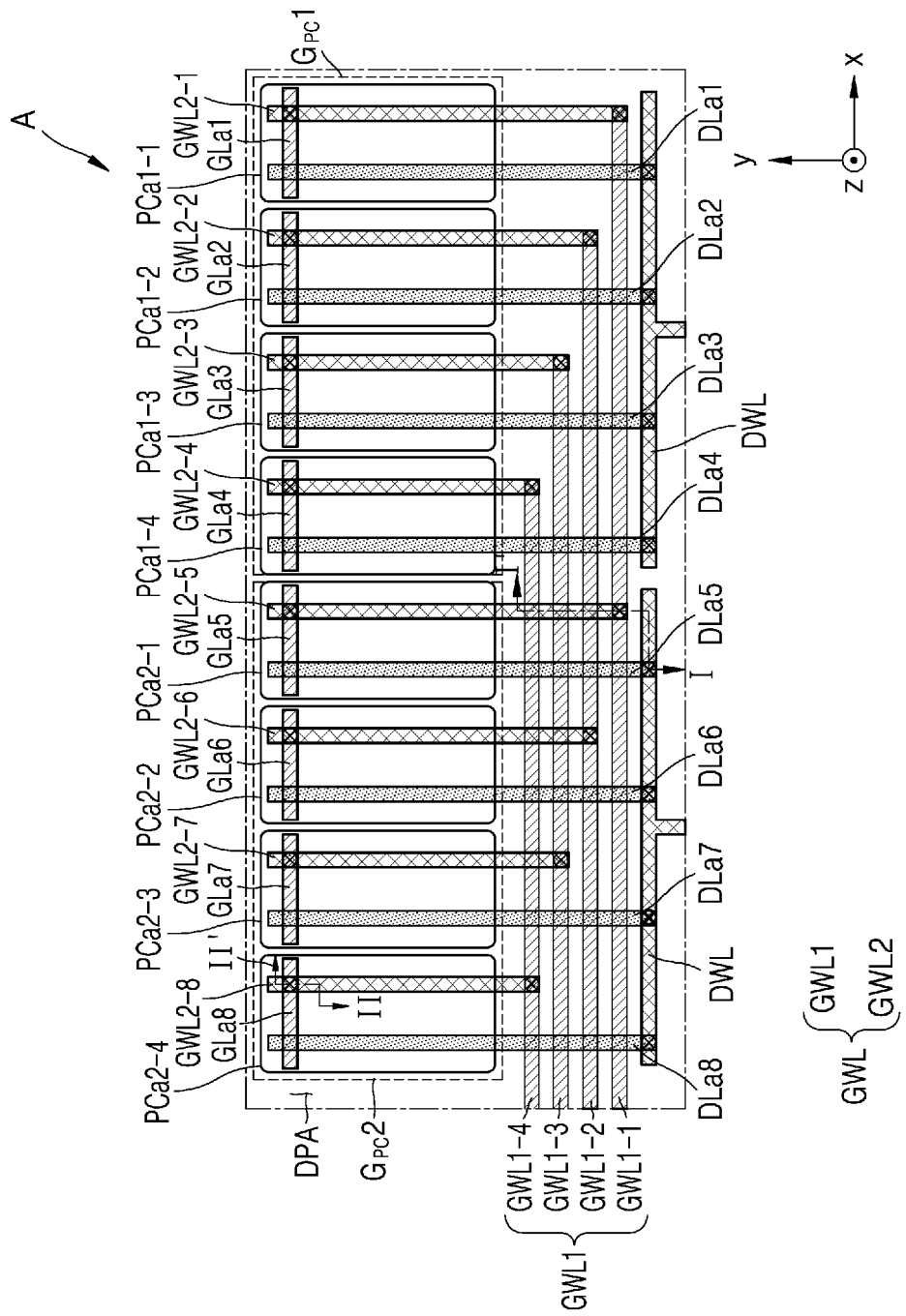
FIG. 6A is an enlarged plan view illustrating a peripheral area of FIG. 5.

FIG. 5 is a plan view illustrating a portion of the display panel 10 according to an embodiment. FIG. 6A is an enlarged plan view illustrating the peripheral area DPA of FIG. 5. For convenience of illustration, some members, elements, or layers may not be shown in FIG. 6A.

Referring to FIG. 5, the plurality of main pixels PXm may be located at (e.g., in or on) the main display area MDA. As used herein, a pixel PX may be a minimum unit for forming an image, and may be defined by an emission area where light is emitted due to the display element DE. The main pixel PXm may be an emission area where light is emitted due to the main display element DEm, and the auxiliary pixel PXa may be an emission area where light is emitted due to the auxiliary display element DEa. When an organic light-emitting diode is used as the display element DE, the emission area may be defined by an opening of a pixel-defining film, which will be described in more detail below.

Because the pixel PX may be an emission area that emits light due to the display element DE, the pixel PX may be located to correspond to the display element DE. The main pixel PXm may be located to correspond to the main display element DEm, and the auxiliary pixel PXa may be located to correspond to the auxiliary display element DEa.

In some embodiments, the main pixel PXm located at (e.g., in or on) the main display area MDA may include a first main pixel PXm1, a second main pixel PXm2, and a third main pixel PXm3. The first main pixel PXm1, the second main pixel PXm2, and the third main pixel PXm3 may display a red color, a green color, and a blue color, respectively.

The first main pixel PXm1, the second main pixel PXm2, and the third main pixel PXm3 may be arranged in an RGBG structure (e.g., a PENTILE® structure, PENTILE® being a duly registered trademark of Samsung Display Co., Ltd.). For example, the first main pixel PXm1 may be located at first and third vertices that are opposite to each other from among the vertices of a virtual quadrangle with a central point at the second main pixel PXm2 as the central point of the virtual quadrangle. In this case, the third main pixels PXm3 may be located at second and fourth vertices that are the remaining vertices of the virtual quadrangle. The second main pixel PXm2 may be smaller than the first main pixel PXm1 and the third main pixel PXm3. Such a pixel arrangement structure may be referred to as an RGBG matrix structure or an RGBG structure (e.g., a PENTILE® matrix structure or a PENTILE® structure), and a rendering driving method that represents a color by sharing adjacent pixels may be used, thereby displaying an image having a high resolution with a smaller number of pixels.

Although the plurality of main pixels PXm are shown in FIG. 5 as being arranged in the RGBG matrix structure, the present disclosure is not limited thereto. For example, the plurality of main pixels PXm may be arranged in any of various suitable structures, such as a stripe structure, a mosaic arrangement structure, a delta arrangement structure, or the like.

At (e.g., in or on) the main display area MDA, the main pixel circuits PCm may overlap with the main pixels PXm. The main pixel circuits PCm may overlap with the main display elements DEm. The main pixel circuits PCm may be arranged in a matrix shape along the x-direction and the y-direction. As used herein, the main pixel circuit PCm refers to a unit of the pixel circuit PC for implementing one main pixel PXm.

A plurality of auxiliary pixels PXa may be located at (e.g., in or on) the component area CA. Each of the plurality of auxiliary pixels PXa may emit any suitable one of a red light, a green light, and/or a blue light.

The number of the auxiliary pixels PXa located at (e.g., in or on) the component area CA per unit area may be less than the number of the main pixels PXm located at (e.g., in or on) the main display area MDA per unit area. A ratio between the number of the auxiliary pixels PXa and the number of the main pixels PXm located per unit area may be 1:2, 1:4, 1:8, 1:9, or 1:12.25. In other words, a ratio between a resolution of the component area CA and a resolution of the main display area MDA may be ½, ¼, ⅛, ⅑, or 1:12.25. In FIG. 5, the ratio between a resolution of the component area CA and the resolution of the main display area MDA is shown as 1:12.25.

The auxiliary pixels PXa located at (e.g., in or on) the component area CA may be arranged in any of various suitable structures. Some of the auxiliary pixels PXa may be gathered to form a pixel group, and may be arranged in any of various suitable structures, for example, such as an RGBG structure (e.g., a PENTILE® structure), a stripe structure, a mosaic arrangement structure, a delta arrangement structure, or the like, within the pixel group. In this case, a distance between the auxiliary pixels PXa located in the pixel group may be the same or substantially the same as a distance between the main pixels PXm.

As another example, as shown in FIG. 5, the auxiliary pixels PXa may be distributed at (e.g., in or on) the component area CA. A distance between adjacent ones of the auxiliary pixels PXa from among the plurality of auxiliary pixels PXa may be constant or substantially constant.

For example, at (e.g., in or on) the component area CA, a distance d1 between an auxiliary pixel $PXa_{23}$ located in a second row and a third column and an auxiliary pixel $PXa_{24}$ located in a second row and a fourth column may be the same or substantially the same as a distance d2 between the auxiliary pixel $PXa_{23}$ located in the second row and the third column and an auxiliary pixel $PXa_{33}$ located in a third row and a third column. The distance d2 between the auxiliary pixel $PXa_{23}$ located in the second row and the third column and the auxiliary pixel $PXa_{33}$ located in the third row and the third column may be the same or substantially the same as a distance d3 between the auxiliary pixel $PXa_{23}$ located in the second row and the third column and an auxiliary pixel $PXa_{22}$ located in a second row and a second column. The distance d3 between the auxiliary pixel $PXa_{23}$ located in the second row and the third column and the auxiliary pixel $PXa_{22}$ located in the second row and the second column may be the same or substantially the same as a distance d4 between the auxiliary pixel $PXa_{23}$ located in the second row and the third column and an auxiliary pixel $PXa_{13}$ located in a first row and a third column. Although the auxiliary pixel $PXa_{23}$ located in the second row and the third column at (e.g., in or on) the component area CA is described in more detail, the same or substantially the same description may be applied to the other auxiliary pixels PXa.

Because the plurality of auxiliary pixels PXa may be located to correspond to the plurality of auxiliary display elements DEa, respectively, a distance between adjacent ones of the auxiliary display elements DEa from among the plurality of auxiliary display elements DEa may be constant or substantially constant.

For example, at (e.g., in or on) the component area CA, a distance d1 between an auxiliary element $DEa_{23}$ located in a second row and a third column and an auxiliary display element $DEa_{24}$ located in a second row and a fourth column may be the same or substantially the same as a distance d2 between the auxiliary display element $DEa_{23}$ located in the second row and the third column and an auxiliary display element $DEa_{33}$ located in a third row and a third column. The distance d2 between the auxiliary display element $DEa_{23}$ located in the second row and the third column and the auxiliary display element $DEa_{33}$ located in the third row and the third column may be the same or substantially the same as a distance d3 between the auxiliary display element $DEa_{23}$ located in the second row and the third column and an auxiliary display element $DEa_{22}$ located in a second row and a second column. The distance d3 between the auxiliary display element $DEa_{23}$ located in the second row and the third column and the auxiliary display element $DEa_{22}$ located in the second row and the second column may be the same or substantially the same as a distance d4 between the auxiliary display element $DEa_{23}$ located in the second row and the third column and an auxiliary display element $DEa_{13}$ located in a first row and a third column. Although the auxiliary display element $DEa_{23}$ located in the second row and the third column at (e.g., in or on) the component area CA is described in more detail, the same or substantially the same description may be applied to the other auxiliary display elements DEa.

Although a distance between adjacent ones of the auxiliary display elements DEa from among the plurality of auxiliary display elements DEa is constant or substantially constant in FIG. 5, as another example, a distance between adjacent ones of the auxiliary display elements DEa may be different.

A distance between the auxiliary pixels PXa may be greater than a distance between the main pixels PXm. A portion of the component area CA where the auxiliary pixels PXa are not located may be the transmissive area TA having a high light transmittance.

The auxiliary pixel circuits PCa for implementing light emission of the auxiliary pixels PXa may be located at (e.g., in or on) the peripheral area DPA. The auxiliary pixel circuits PCa may be located at (e.g., in or on) a region of the peripheral area DPA that is adjacent to the main display area MDA, and may be arranged along the x-direction. In other words, the auxiliary pixel circuits PCa may be located in the same row as each other. Because the auxiliary pixel circuits PCa are not located at (e.g., in or on) the component area CA, the component area CA may secure a wider transmissive area TA.

The auxiliary pixel circuits PCa may be connected to the auxiliary display elements DEa, respectively, through the electrode connection wirings EWL. The plurality of auxiliary pixel circuits PCa located at (e.g., in or on) a left side of a virtual line $\ell$, which passes or substantially passes through the center of the display panel 10 in the y-direction, and the plurality of auxiliary pixel circuits PCa located at (e.g., in or on) a right side of the virtual line $\ell$ may be symmetric or substantially symmetric with each other relative to the virtual line $\ell$. Also, the plurality of electrode connection wirings EWL located at (e.g., in or on) the left side of the virtual line $\ell$ and the plurality of electrode connection wirings EWL located at (e.g., in or on) the right side of the virtual line $\ell$ may be symmetric or substantially symmetric with each other relative to the virtual line $\ell$.

Although the plurality of auxiliary pixel circuits PCa and the plurality of electrode connection wirings EWL located at (e.g., in or on) the left side of the virtual line $\ell$ are described in more detail, the same or substantially the same description may be applied to the plurality of auxiliary pixel circuits PCa and the plurality of electrode connection wirings EWL located at (e.g., in or on) the right side of the virtual line $\ell$.

The plurality of auxiliary pixel circuits PCa may be divided into a plurality of pixel circuit groups $G_{PC}$. The plurality of auxiliary display elements DEa may be divided into a plurality of display element groups $G_{DE}$ that are connected to the plurality of pixel circuit groups $G_{PC}$, respectively. In this case, each of the plurality of display element groups $G_{DE}$ may be a set of auxiliary display elements DEa that are located in the same column as each other from among the plurality of auxiliary display elements DEa. In other words, the plurality of auxiliary display elements DEa may be grouped in units of the columns. The auxiliary display elements DEa grouped in the same unit of the columns may be connected to the auxiliary pixel circuits PCa, respectively, included in the same pixel circuit group $G_{PC}$.

For example, the plurality of auxiliary pixel circuits PCa may be divided into a first pixel circuit group $G_{PC}1$ and a second pixel circuit group $G_{PC}2$. The plurality of auxiliary display elements DEa may be divided into a first display element group $G_{DE}1$ and a second display element group $G_{DE}2$. The first display element group $G_{DE}1$ may be connected to the first pixel circuit group $G_{PC}1$, and the second display element group $G_{DE}2$ may be connected to the second pixel circuit group $G_{PC}2$. In this case, the first display element group $G_{DE}1$ may be a set of auxiliary display elements DEa located in the first column from among the plurality of auxiliary display elements DEa, and the second display element group $G_{DE}2$ may be a set of auxiliary display elements DEa located in the second column from among the plurality of auxiliary display elements DEa. In other words, the first display element group $G_{DE}1$ may include an auxiliary display element $DEa_{11}$ located in a first row and a first column, an auxiliary display element $DEa_{21}$ located in a second row and the first column, an auxiliary display element $DEa_{31}$ located in a third row and the first column, and an auxiliary display element $DEa_{41}$ located in a fourth row and the first column. The second display element group $G_{DE}2$ may include an auxiliary display element $DEa_{12}$ located in a first row and a second column, an auxiliary display element $DEa_{22}$ located in a second row and the second column, an auxiliary display element $DEa_{32}$ located in a third row and the second column, and an auxiliary display element $DEa_{42}$ located in a fourth row and the second column.

The number of the auxiliary pixel circuits PCa included in the pixel circuit group $G_{PC}$ may be the same as the number of the auxiliary display elements DEa included in the display element group $G_{DE}$. For example, as shown in FIG. 5, when four auxiliary display elements DEa are located in the display element group $G_{DE}$, four auxiliary pixel circuits PCa may be included in the pixel circuit group $G_{PC}$.

A distance between a display element group $G_{DE}$ that is a set of auxiliary display elements DEa located in an $n^{th}$ column at (e.g., in or on) the component area CA and a pixel circuit group $G_{PC}$ connected to the display element group $G_{DE}$ may be less than a distance between a display element group $G_{DE}$ that is a set of auxiliary display elements DEa located in an $n+1^{th}$ column and a pixel circuit group $G_{PC}$ connected to the display element group $G_{DE}$. Here, n is a positive integer.

For example, as shown in FIG. 5, a distance between the first display element group $G_{DE}1$ that is a set of auxiliary display elements DEa located in the first column at (e.g., in or on) the component area CA and the first pixel circuit group $G_{PC}1$ connected to the first display element group $G_{DE}1$ may be less than a distance between the second display element group $G_{DE}2$ that is a set of auxiliary display elements DEa located in the second column and the second pixel circuit group $G_{PC}2$ connected to the second display element group $G_{DE}2$.

The auxiliary pixel circuits PCa included in the pixel circuit group $G_{PC}$ may be connected to the auxiliary display elements DEa, respectively, in an order of adjacency of the auxiliary pixel circuits PCa to the component area CA. In this case, the auxiliary display elements DEa may be connected to the auxiliary pixel circuits PCa, respectively, in an order of adjacency of the auxiliary display elements DEa to the peripheral area DPA.

For example, as shown in FIGS. 5 and 6A, the first pixel circuit group $G_{PC}1$ may include a $1$-$1^{th}$ auxiliary pixel circuit PCa1-1, a $1$-$2^{th}$ auxiliary pixel circuit PCa1-2, a $1$-$3^{th}$ auxiliary pixel circuit PCa1-3, and a $1$-$4^{th}$ auxiliary pixel circuit PCa1-4. The $1$-$1^{th}$ auxiliary pixel circuit PCa1-1, the $1$-$2^{th}$ auxiliary pixel circuit PCa1-2, the $1$-$3^{th}$ auxiliary pixel circuit PCa1-3, and the $1$-$4^{th}$ auxiliary pixel circuit PCa1-4 may be adjacent to (e.g., may be located in increasing distance from) the component area CA in the described order. The $1$-$1^{th}$ auxiliary pixel circuit PCa1-1 that is closest to the component area CA may be connected to the auxiliary display element $DEa_{11}$ located in the first row and the first column that is closest to the peripheral area DPA. The $1$-$4^{th}$ auxiliary pixel circuit PCa1-4 that is farthest from the component area CA may be connected to the auxiliary display element $DEa_{41}$ located in the fourth row and the first column that is farthest from the peripheral area DPA. Although the first pixel circuit group $G_{PC}1$ is described in more detail, the same or substantially the same description may be applied to the second pixel circuit group $G_{PC}2$.

Each of the electrode connection wirings EWL may include a first electrode connection wiring EWL1 located at (e.g., in or on) the peripheral area DPA, and a second electrode connection wiring EWL2 located at (e.g., in or on) the component area CA. The first electrode connection wiring EWL1 may extend in the x-direction and the y-direction, and the second electrode connection wiring EWL2 may also extend in the x-direction and the y-direction.

One end of the first electrode connection wiring EWL1 may be connected to the auxiliary pixel circuit PCa, and the other end of the first electrode connection wiring EWL1 may be connected to the second electrode connection wiring EWL2. The first electrode connection wiring EWL1 may include a first portion EWL1a extending in the y-direction, a second portion EWL1b extending in the x-direction, and a third portion EWL1c extending in the y-direction. The first electrode connection wiring EWL1 may include a conductive material including molybdenum (Mo), aluminum (Al), copper (Cu), or titanium (Ti), and may have a single layer structure or a multi-layered structure including one or more of the above-described materials.

As a distance between the second portion EWL1b of the first electrode connection wiring EWL1 and the component area CA increases, a total length of the first electrode connection wiring EWL1 may increase. When a distance between the second portion EWL1b of the first electrode connection wiring EWL1 and the component area CA is the largest, a total length of the first electrode connection wiring EWL1 may be the largest.

One end of the second electrode connection wiring EWL2 may be connected to the first electrode connection wiring EWL1, and the other end of the second electrode connection wiring EWL2 may be connected to the auxiliary display element DEa. As shown in FIG. 5, one end of the second electrode connection wiring EWL2 may be connected to the first electrode connection wiring EWL1 at an edge of the component area CA. The second electrode connection wiring EWL2 may include a transparent conductive material. For example, the second electrode connection wiring EWL2 may include a transparent conductive oxide (TCO). The second electrode connection wiring EWL2 may include a conductive oxide, for example, such as indium tin oxide (ITO), indium zinc oxide (IZO), zinc oxide (ZnO), indium oxide ($In_2O_3$), indium gallium oxide (IGO), or aluminum zinc oxide (AZO).

Although lengths of the second electrode connection wirings EWL2 are different from one another in FIG. 5, in other embodiments, the lengths of the second electrode connection wirings EWL2 may be the same or substantially the same as each other. For example, ends of the second electrode connection wirings EWL2 may extend up to a boundary between the main display area MDA and the component area CA. In this case, electrical loads due to the second electrode connection wirings EWL2 may match or substantially match each other. Accordingly, luminance deviation (e.g., luminance variation) at (e.g., in or on) the component area CA may be minimized or reduced.

The first electrode connection wiring EWL1 and the second electrode connection wiring EWL2 may be located at (e.g., in or on) the same layer as each other, or may be located at (e.g., in or on) different layers from each other. When the first electrode connection wiring EWL1 and the second electrode connection wiring EWL2 are located at (e.g., in or on) different layers from each other, the first electrode connection wiring EWL1 and the second electrode connection wiring EWL2 may be connected to each other through a contact hole.

The first electrode connection wiring EWL1 may have a conductivity that is higher than that of the second electrode connection wiring EWL2. Because the first electrode connection wiring EWL1 is located at (e.g., in or on) the peripheral area DPA, and thus, may not need to ensure a light transmittance, the first electrode connection wiring EWL1 may include a material having a lower light transmittance and a higher conductivity than those of the second electrode connection wiring EWL2. Accordingly, a resistance value of the electrode connection wiring EWL may be minimized or reduced.

Although the electrode connection wiring EWL includes the first electrode connection wiring EWL1 and the second electrode connection wiring EWL2 formed of different materials from each other according to an embodiment, the present disclosure is not limited thereto. As another example, the electrode connection wiring EWL may be integrally provided from the peripheral area DPA to the auxiliary display elements DEa of the component area CA.

When the electrode connection wiring EWL is connected to the auxiliary display element DEa, the electrode connection wiring EWL may be electrically connected to a pixel electrode of the auxiliary display element DEa. Also, the electrode connection wiring EWL may be connected to the auxiliary pixel PXa implemented as the auxiliary display element DEa.

A gate line GL may include the main gate line GLm connected to the main pixel circuits PCm, and the auxiliary gate line GLa connected to the auxiliary pixel circuits PCa.

The main gate line GLm may extend in the x-direction, and may be connected to the main pixel circuits PCm that are located in the same row as each other. The main gate line GLm may not be located at (e.g., in or on) the component area CA. In other words, the main gate line GLm may be disconnected with the component area CA therebetween. In this case, the main gate line GLm located on the left side of the component area CA may receive a signal from a left gate driving circuit GDC, and the main gate line GLm located on the right side of the component area CA may receive a signal from a right gate driving circuit GDC.

The auxiliary gate line GLa may be connected to the main gate line GLm through a gate connection wiring GWL. The auxiliary gate line GLa may be connected to the main gate line GLm that is disconnected by the component area CA from among the main gate lines GLm through the gate connection wiring GWL. The auxiliary gate line GLa may be connected to the main gate line GLm that is adjacent to the component area CA in the x-direction from among the main gate lines GLm through the gate connection wiring GWL. For example, each of the auxiliary gate lines GLa may be connected to a first main gate line GLm1, a second main gate line GLm2, a third main gate line GLm3, and a fourth main gate line GLm4 that are adjacent to the component area CA in the x-direction from among the main gate lines GLm.

As described above with reference to FIG. 3, the plurality of gate driving circuits GDC that are connected to the plurality of main gate lines GLm, respectively, may be located at (e.g., in or on) a side portion of the peripheral area DPA. The gate connection wirings GWL may be connected to the gate driving circuits GDC, respectively, from among the plurality of gate driving circuits GDC that are connected to the main gate lines GLm that are adjacent to the component area CA in the x-direction. In this case, the main gate lines GLm may extend from the gate driving circuits GDC, respectively, to the main display area MDA. In other words, the main gate lines GLm may respectively extend from the gate driving circuits GDC in the +x direction. The gate connection wirings GWL may extend from the gate driving circuits GDC, respectively, to the peripheral area DPA. In other words, the gate connection wirings GWL may respectively extend from the gate driving circuits GDC in the −x direction.

For example, as shown in FIG. 5, the first main gate line GLm1 that is adjacent to the component area CA in the x-direction may be connected to the first gate driving circuit GDC1, and may extend from the first gate driving circuit GDC1 to the main display area MDA. The gate connection wiring GWL may be connected to the first gate driving circuit GDC1, and may extend from the first gate driving circuit GDC1 to the peripheral area DPA. The gate connection wiring GWL may be connected to the first main gate line GLm1 through the first gate driving circuit GDC1. Although the first main gate line GLm1 is described in more detail, the same or substantially the same description may be applied to the second through fourth main gate lines GLm2, GLm3, and GLm4.

The number of the main gate lines GLm connected to the auxiliary gate line GLa may be the same as the number of the auxiliary pixels PXa that are located at (e.g., in or on) the component area CA and arranged along the y-direction. For example, as shown in FIG. 5, when the number of the auxiliary pixels PXa located at (e.g., in or on) the component area CA and arranged along the y-direction is 4, the number of the main gate lines GLm that are connected to the auxiliary gate line GLa may be 4.

The gate connection wiring GWL may include a first gate connection wiring GWL1 connected to the main gate line GLm and extending in the x-direction and the y-direction, and a second gate connection wiring GWL2 extending in the y-direction and connected to the auxiliary gate line GLa. The auxiliary gate line GLa may be connected to the main gate line GLm through the first gate connection wiring GWL1 and the second gate connection wiring GWL2.

Referring to FIG. 6A, in an embodiment, the auxiliary gate lines GLa that are connected to different pixel circuit groups $G_{PC}$, respectively, from among the plurality of auxiliary gate lines GLa may be connected to one another.

For example, a first auxiliary gate line GLa1 may be connected to the $1\text{-}1^{th}$ auxiliary pixel circuit PCa1-1 included in the first pixel circuit group $G_{PC}1$. A fifth auxiliary gate line GLa5 may be connected to a $2\text{-}1^{th}$ auxiliary pixel circuit PCa2-1 included in the second pixel circuit group $G_{PC}2$. The first auxiliary gate line GLa1 and the fifth auxiliary gate line GLa5 that are connected to different pixel circuit groups $G_{PC}$ from each other may be connected to each other. In other words, each of a $2\text{-}1^{th}$ gate connection wiring GWL2-1 that is connected to the first auxiliary gate line GLa1 and a $2\text{-}5^{th}$ gate connection wiring GWL2-5 that is connected to the fifth auxiliary gate line GLa5 may be connected to a $1\text{-}1^{th}$ gate connection wiring GWL1-1, and the first auxiliary gate line GLa1 and the fifth auxiliary gate line GLa5 may be connected to each other.

A second auxiliary gate line GLa2 may be connected to the $1\text{-}2^{th}$ auxiliary pixel circuit PCa1-2 included in the first pixel circuit group $G_{PC}1$. A sixth auxiliary gate line GLa6 may be connected to a $2\text{-}2^{th}$ auxiliary pixel circuit PCa2-2 included in the second pixel circuit group $G_{PC}2$. The second auxiliary gate line GLa2 and the sixth auxiliary gate line GLa6 that are connected to different pixel circuit groups $G_{PC}$ from each other may be connected to each other. In other words, a $2\text{-}2^{th}$ gate connection wiring GWL2-2 that is connected to the second auxiliary gate line GLa2 and a $2\text{-}6^{th}$ gate connection wiring GWL2-6 that is connected to the sixth auxiliary gate line GLa6 may be connected to a $1\text{-}2^{th}$ gate connection wiring GWL1-2, and the second auxiliary gate line GLa2 and the sixth auxiliary gate line GLa6 may be connected to each other.

A third auxiliary gate line GLa3 may be connected to the $1\text{-}3^{th}$ auxiliary pixel circuit PCa1-3 included in the first pixel circuit group $G_{PC}1$. A seventh auxiliary gate line GLa7 may be connected to a $2\text{-}3^{th}$ auxiliary pixel circuit PCa2-3 included in the second pixel circuit group $G_{PC}2$. The third auxiliary gate line GLa3 and the seventh auxiliary gate line GLa7 that are connected to different pixel circuit groups Gp from each other may be connected to each other. In other words, a $2\text{-}3^{th}$ gate connection wiring GWL2-3 that is connected to the third auxiliary gate line GLa3 and a $2\text{-}7^{th}$ gate connection wiring GWL2-7 that is connected to the seventh auxiliary gate line GLa7 may be connected to a $1\text{-}3^{th}$ gate connection wiring GWL1-3, and the third auxiliary gate line GLa3 and the seventh auxiliary gate line GLa7 may be connected to each other.

A fourth auxiliary gate line GLa4 may be connected to the $1\text{-}4^{th}$ auxiliary pixel circuit PCa1-4 included in the first pixel circuit group $G_{PC}1$. An eighth auxiliary gate line GLa8 may be connected to a $2\text{-}4^{th}$ auxiliary pixel circuit PCa2-4 included in the second pixel circuit group $G_{PC}2$. The fourth auxiliary gate line GLa4 and the eighth auxiliary gate line GLa8 that are connected to different pixel circuit groups $G_{PC}$ from each other may be connected to each other. In other words, a $2\text{-}4^{th}$ gate connection wiring GWL2-4 that is connected to the fourth auxiliary gate line GLa4 and a $2\text{-}8^{th}$ gate connection wiring GWL2-8 that is connected to the eighth auxiliary gate line GLa8 may be connected to a $1\text{-}4^{th}$ gate connection wiring GWL1-4, and the fourth auxiliary gate line GLa4 and the eighth auxiliary gate line GLa8 may be connected to each other.

In this case, as shown in FIG. 5, the $1\text{-}1^{th}$ auxiliary pixel circuit PCa1-1 may be connected to the auxiliary display element $DEa_{11}$ located in the first row and the first column at (e.g., in or on) the component area CA, and the $2\text{-}1^{th}$ auxiliary pixel circuit PCa2-1 may be connected to the auxiliary display element $DEa_{12}$ located in the first row and the second column at (e.g., in or on) the component area CA. In other words, because the auxiliary gate lines GLa that are respectively connected to the auxiliary pixel circuits PCa for driving the auxiliary display elements DEa located in the same row as each other may be connected to one another, the same signal may be applied to the auxiliary pixel circuits PCa for driving the auxiliary display element DEa that are located in the same row as each other. Also, because the $1\text{-}1^{th}$ gate connection wiring GWL1-1 may be connected to the first main gate line GLm1 through the first gate driving circuit GDC1, the same signal may be applied to the pixel circuits PC for driving the main display element DEm and the auxiliary display element DEa located in the same row as each other. Although the $1\text{-}1^{th}$ auxiliary pixel circuit PCa1-1 and the $2\text{-}1^{th}$ auxiliary pixel circuit PCa2-1 are described in more detail, the same or substantially the same description may be applied to the other auxiliary pixel circuits PCa.

The first gate connection wiring GWL1 and the second gate connection wiring GWL2 may be located at (e.g., in or on) different layers from each other, and the first gate connection wiring GWL1 and the second gate connection wiring GWL2 may be connected to each other through a contact hole formed in an insulating layer. The second gate connection wiring GWL2 and the auxiliary gate line GLa may be located at (e.g., in or on) different layers from each other, and the second gate connection wiring GWL2 and the auxiliary gate line GLa may be connected to each other through a contact hole formed in an insulating layer.

Referring again to FIG. 5, the data line DL may include the main data line DLm connected to the main pixel circuits PCm, and the auxiliary data line DLa connected to the auxiliary pixel circuits PCa.

The main data line DLm may extend in the y-direction, and may be connected to the main pixel circuits PCm that are located in the same column as each other. The main data line DLm may not be located at (e.g., in or on) the component area CA.

The auxiliary data line DLa may be connected to the main data line DLm through a data connection wiring DWL. The auxiliary data line DLa may be connected to the main data line DLm that is disconnected by the component area CA from among the main data lines DLm through the data connection wiring DWL. The auxiliary data line DLa may be connected to the main data line DLm that is adjacent to the component area CA in the y-direction from among the main data lines DLm through the data connection wiring DWL. For example, each of the auxiliary data lines DLa may be connected to a first main data line DLm1 and a second main data line DLm2 that are adjacent to the component area CA in the y-direction from among the main data lines DLm. Although each of the auxiliary data lines DLa is connected to the first main data line DLm1 and the second main data line DLm2 in FIG. 5, the present disclosure is not limited thereto, and each of the auxiliary data lines DLa may be connected to any suitable one of the main data lines DLm disconnected by the component area CA.

The data connection wiring DWL may extend in the x-direction and the y-direction to connect the main data line DLm to the auxiliary data line DLa. The data connection wiring DWL may have a shape that is bent at least one time. The data connection wiring DWL may be located to bypass (e.g., to extend around) the component area CA. The data connection wiring DWL may overlap with the main pixel circuits PCm located at (e.g., in or on) the main display area MDA. As the data connection wiring DWL is located at (e.g., in or on) the main display area MDA, a separate space in which the data connection wiring DWL is located may not be used or needed, thereby minimizing or reducing a size of a dead space.

The data connection wiring DWL may be located at a different layer from those of the main data line DLm and the auxiliary data line DLa, and the data connection wiring DWL may connect the main data line DLm to the auxiliary data line DLa through contact holes.

Referring to FIG. 6A, in an embodiment, the auxiliary data lines DLa that are connected to the same pixel circuit group $G_{PC}$ from among the plurality of auxiliary data lines DLa may be connected to one another.

For example, a first auxiliary data line DLa1, a second auxiliary data line DLa2, a third auxiliary data line DLa3, and a fourth auxiliary data line DLa4 may be connected to the 1-1$^{th}$ auxiliary pixel circuit PCa1-1, the 1-2$^{th}$ auxiliary pixel circuit PCa1-2, the 1-3$^{th}$ auxiliary pixel circuit PCa1-3, and the 1-4$^{th}$ auxiliary pixel circuit PCa1-4, respectively, included in the first pixel circuit group $G_{PC}1$. The first auxiliary data line DLa1, the second auxiliary data line DLa2, the third auxiliary data line DLa3, and the fourth auxiliary data line DLa4 that are connected to the same first pixel circuit group $G_{PC}1$ as each other may be connected to one another. In other words, the first auxiliary data line DLa1, the second auxiliary data line DLa2, the third auxiliary data line DLa3, and the fourth auxiliary data line DLa4 may be connected to the same data connection wiring DWL as each other.

A fifth auxiliary data line DLa5, a sixth auxiliary data line DLa6, a seventh auxiliary data line DLa7, and an eighth auxiliary data line DLa8 may be connected to the 2-1$^{th}$ auxiliary pixel circuit PCa2-1, the 2-2$^{th}$ auxiliary pixel circuit PCa2-2, the 2-3$^{th}$ auxiliary pixel circuit PCa2-3, and the 2-4$^{th}$ auxiliary pixel circuit PCa2-4, respectively, included in the second pixel circuit group $G_{PC}2$. The fifth auxiliary data line DLa5, the sixth auxiliary data line DLa6, the seventh auxiliary data line DLa7, and the eighth auxiliary data line DLa8 that are connected to the same second pixel circuit group $G_{PC}2$ as each other may be connected to one another. In other words, the fifth auxiliary data line DLa5, the sixth auxiliary data line DLa6, the seventh auxiliary data line DLa7, and the eighth auxiliary data line DLa8 may be connected to the same data connection wiring DWL as each other.

In this case, as shown in FIG. 5, the 1-1$^{th}$ auxiliary pixel circuit PCa1-1 may be connected to the auxiliary display element DEa$_{11}$ located in the first row and the first column at (e.g., in or on) the component area CA, the 1-2$^{th}$ auxiliary pixel circuit PCa1-2 may be connected to the auxiliary display element DEa$_{21}$ located in the second row and the first column at (e.g., in or on) the component area CA, the 1-3$^{th}$ auxiliary pixel circuit PCa1-3 may be connected to the auxiliary display element DEa$_{31}$ located in the third row and the first column at (e.g., in or on) the component area CA, and the 1-4$^{th}$ auxiliary pixel circuit PCa1-4 may be connected to the auxiliary display element DEa$_{41}$ located in the fourth row and the first column at (e.g., in or on) the component area CA. In other words, because the auxiliary data lines DLa that are respectively connected to the auxiliary pixel circuits PCa for driving the auxiliary display elements DEa that are located in the same column as each other may be connected to one another, the same signal may be applied to the auxiliary pixel circuits PCa for driving the auxiliary display element DEa located in the same column as each other. Also, because the auxiliary data lines DLa that are respectively connected to the auxiliary pixel circuits PCa for driving the auxiliary display elements DEa that are located in the same column as each other may be connected to the first main data line DLm1 through the data connection wiring DWL, the same signal may be applied to the pixel circuits PC for driving the main display element DEm and the auxiliary display element DEa located in the same column as each other. Although the 1-1$^{th}$ auxiliary pixel circuit PCa1-1, the 1-2$^{th}$ auxiliary pixel circuit PCa1-2, the 1-3$^{th}$ auxiliary pixel circuit PCa1-3, and the 1-4$^{th}$ auxiliary pixel circuit PCa1-4 are described in more detail, the same or substantially the same description may be applied to the other auxiliary pixel circuits PCa.

Although FIG. 5 shows that the elements are symmetric with each other relative to the virtual line ℓ, the present disclosure is not limited thereto, and in an embodiment, the auxiliary pixel circuits PCa that are located on the right side of the virtual line ℓ may all be located on the left side of the virtual line ℓ. In another embodiment, the auxiliary pixel circuits PCa that are located on the left side of the virtual line ℓ may all be located on the right side of the virtual line ℓ.

Figure 6B:
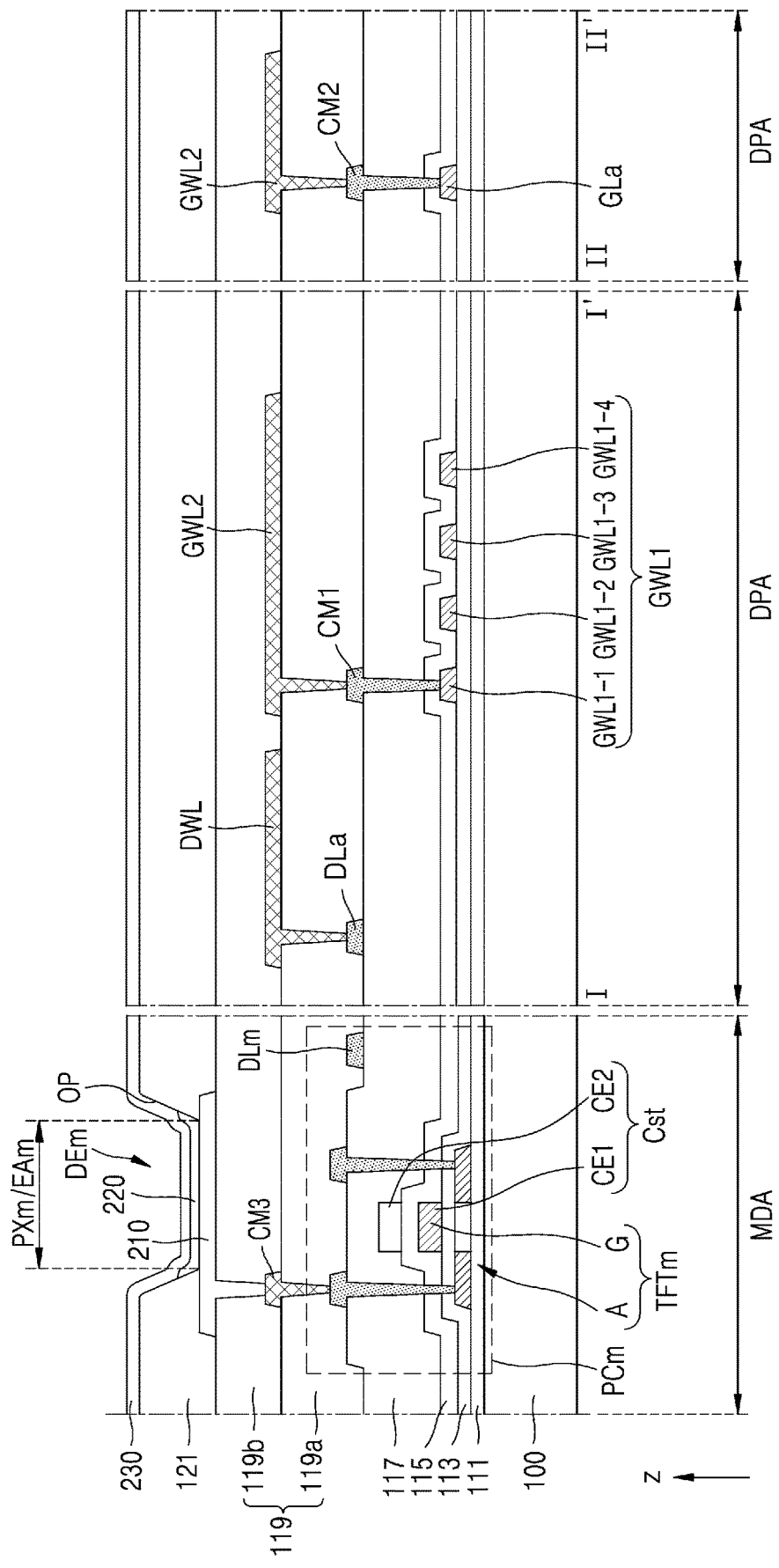
FIG. 6B is a cross-sectional view taken along the lines I-I' and II-II' of FIG. 6A, and shows a main pixel circuit of FIG. 5, and a gate connection wiring and a data connection wiring of FIG. 6A.

FIG. 6B is a cross-sectional view taken along the lines I-I' and II-II' of FIG. 6A, and shows the main pixel circuit PCm of FIG. 5, and the gate connection wiring GWL and the data connection wiring DWL of FIG. 6A. In FIG. 6B, the same or substantially the same members, elements, and layers as those of FIGS. 5 and 6A are denoted by the same reference symbols, and thus, redundant description thereof may not be repeated.

Referring to FIG. 6B, the main pixel PXm may be located at (e.g., in or on) the main display area MDA. Also, the main pixel circuit PCm including the main thin-film transistor TFTm and the storage capacitor Cst, and the main display element DEm connected to the main pixel circuit PCm may be located at (e.g., in or on) the main display area MDA. Although the organic light-emitting diode is used as the display element in the present embodiment, in another embodiment, an inorganic light-emitting device or a quantum dot light-emitting device may be used as the display element.

Elements included in the display panel 10 will be described in more detail according to a stacked structure thereof with reference to FIG. 6B, and a positional relationship between the gate connection wiring GWL and the data connection wiring DWL will be described in more detail.

The substrate 100 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, and/or bendable. The substrate 100 may have a multi-layered structure including a layer including the polymer resin, and an inorganic layer.

A buffer layer 111 may be on the substrate 100 to reduce or block penetration of a foreign material, moisture, and/or external air from the bottom of the substrate 100, and may planarize or substantially planarize the substrate 100. The buffer layer 111 may include an inorganic material, for example, such as an oxide or a nitride, an organic material, or a combination of an organic material and an inorganic material. The buffer layer 111 may have a single-layer structure, or a multi-layered structure including an inorganic material and an organic material.

In some embodiments, a barrier layer may be further provided between the substrate 100 and the buffer layer 111. The barrier layer may prevent or reduce impurities from the substrate 100 or the like from penetrating into the semiconductor layer A. The barrier layer may include an inorganic material, for example, such as an oxide or a nitride, an organic material, or a combination of an organic material and an inorganic material. The barrier layer may have a single-layer structure, or a multi-layered structure including an inorganic material and an organic material.

The semiconductor layer A may be located on the buffer layer 111. The semiconductor layer A may include amorphous silicon or polysilicon. In another embodiment, the semiconductor layer A may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

The semiconductor layer A may include a channel region, and a source region and a drain region located on opposite sides (e.g., both sides) of the channel region. The semiconductor layer A may have a single-layer structure or a multi-layered structure.

A first gate insulating layer 113 and a second gate insulating layer 115 may be stacked on the substrate 100 to cover the semiconductor layer A. Each of the first gate insulating layer 113 and the second gate insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A gate electrode G may be located on the first gate insulating layer 113 to at least partially overlap with the semiconductor layer A. Also, the auxiliary gate line GLa and the first gate connection wiring GWL1 may be located on the first gate insulating layer 113. Each of the gate electrode G, the auxiliary gate line GLa, and the first gate connection wiring GWL1 may include molybdenum (Mo), aluminum (Al), copper (Cu), or titanium (Ti), and may have a single-layer structure or a multi-layered structure. For example, when the gate electrode G corresponds to the first gate electrode G1 of the driving transistor T1 (e.g., see FIG. 4), the first gate electrode G1 may have a single-layer structure including Mo.

Although the gate electrode G, the auxiliary gate line GLa, and the first gate connection wiring GWL1 are shown in FIG. 6B as being located on the first gate insulating layer 113, in another embodiment, the gate electrode G, the auxiliary gate line GLa, and the first gate connection wiring GWL1 may be located on a top surface of the second gate insulating layer 115.

In an embodiment, the storage capacitor Cst may include a lower electrode CE1 and an upper electrode CE2, and may overlap with the main thin-film transistor TFTm as shown in FIG. 6B. For example, the gate electrode G of the main thin-film transistor TFTm may function as the lower electrode CE1 of the storage capacitor Cst. However, the present disclosure is not limited thereto, and in another embodiment, the storage capacitor Cst may not overlap with the main thin-film transistor TFTm, and may be separately located (e.g., may be spaced apart from the main thin-film transistor TFTm).

The upper electrode CE2 of the storage capacitor Cst may overlap with the lower electrode CE1, with the second gate insulating layer 115 therebetween, to form a capacitance. In this case, the second gate insulating layer 115 may function as a dielectric layer of the storage capacitor Cst.

An interlayer insulating layer 117 may be provided on the second gate insulating layer 115 to cover the upper electrode CE2 of the storage capacitor Cst. The interlayer insulating layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A source electrode, a drain electrode, the main data line DLm, the auxiliary data line DLa, a first connection electrode CM1, and a second connection electrode CM2 may be located on the interlayer insulating layer 117.

Each of the source electrode, the drain electrode, the main data line DLm, the auxiliary data line DLa, the first connection electrode CM1, and the second connection electrode CM2 may include a conductive material including molybdenum (Mo), aluminum (Al), copper (Cu), or titanium (Ti), and may have a single-layer structure or multi-layered structure including one or more of the above materials. For example, each of the source electrode, the drain electrode, the main data line DLm, the auxiliary data line DLa, the first connection electrode CM1, and the second connection electrode CM2 may have a multi-layered structure including Ti/Al/Ti. The source electrode and the drain electrode may be connected to the source region and the drain region, respectively, of the semiconductor layer A through a contact hole.

In some embodiments, the source electrode, the drain electrode, the main data line DLm, the auxiliary data line DLa, the first connection electrode CM1, and the second connection electrode CM2 may be covered by an inorganic protective layer. The inorganic protective layer may have a single-layer structure, or a multi-layered structure including silicon nitride ($SiN_x$) and silicon oxide ($SiO_x$). The inorganic protective layer may be used to cover and protect at least some of the wirings located on the interlayer insulating layer 117.

A planarization layer 119 is located to cover the source electrode, the drain electrode, the main data line DLm, the auxiliary data line DLa, the first connection electrode CM1, and the second connection electrode CM2. The planarization layer 119 has a contact hole for connecting the main thin-film transistor TFTm to a first pixel electrode 210.

The planarization layer 119 may have a single-layer structure or a multi-layered structure formed of an organic material, and has a flat or substantially flat top surface. The planarization layer 119 may include benzocyclobutene (BCB), polyimide, hexamethyldisiloxane (HMDSO), a general-purpose polymer, for example, such as polymethyl methacrylate (PMMA) or polystyrene (PS), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

In an embodiment, as shown in FIG. 6B, the planarization layer 119 may include a first planarization layer 119a and a second planarization layer 119b.

A third connection electrode CM3, the data connection wiring DWL, and the second gate connection wiring GWL2 may be located on the first planarization layer 119a. The data connection wiring DWL may be connected to the auxiliary data line DLa through a contact hole formed in the first planarization layer 119a. The second gate connection wiring GWL2 may be connected to the first gate connection wiring GWL1 through the first connection electrode CM1, and contact holes formed in the first planarization layer 119a and the interlayer insulating layer 117, respectively. Also, the second gate connection wiring GWL2 may be connected to the auxiliary gate line GLa through the second connection electrode CM2, and contact holes formed in the first planarization layer 119a and the interlayer insulating layer 117, respectively. Although the second gate connection wiring GWL2 is shown in FIG. 6B as being located on the first planarization layer 119a, in another embodiment, the second gate connection wiring GWL2 may be located on the interlayer insulating layer 117.

The main display element DEm is located on the planarization layer 119. The main display element Dem includes the first pixel electrode 210, a first intermediate layer 220 including an organic emission layer, and a counter electrode 230. The main display element DEm may be connected to the main thin-film transistor TFTm through the third connection electrode CM3, and contact holes formed in the planarization layer 119. In other words, the main display element DEm may be connected to the main pixel circuit PCm.

The first pixel electrode 210 may be a transmissive or semi-transmissive electrode, or a reflective electrode. In some embodiments, the first pixel electrode 210 may include a reflective layer formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer formed on the reflective layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the first pixel electrode 210 may include ITO/Ag/ITO.

A pixel-defining film 121 may be located on the planarization layer 119 at (e.g., in or on) the display area DA of the substrate 100. The pixel-defining film 121 may cover an edge of the first pixel electrode 210, and may have a first opening OP through which a central portion of the first pixel electrode 210 is exposed. An emission area EAm of the main display element DEm is defined by the first opening OP. In other words, a size and a shape of the main pixel PXm are defined by the first opening OP. The pixel-defining film 121 may increase a distance between an edge of the first pixel electrode 210 and the counter electrode 230 located over the first pixel electrode 210, to prevent or substantially prevent an arc or the like from occurring at (e.g., in or on) the edge of the first pixel electrode 210.

The pixel-defining film 121 may be formed of at least one organic insulating material selected from the group consisting of polyimide, polyamide, acrylic resin, benzocyclobutene, and phenolic resin, by using spin coating or the like.

The first intermediate layer 220 may be located in the first opening OP of the pixel-defining film 121, and may include the organic emission layer. The organic emission layer may include an organic material including a fluorescent or a phosphorescent material that emits a suitable colored light, for example, such as a red light, a green light, a blue light, or a white light. The organic emission layer may be formed of a low molecular weight organic material or a high molecular weight organic material, and various suitable functional layers, for example, such as a hole transport layer (HTL), a hole injection layer (HIL), an electron transport layer (ETL), and/or an electron injection layer (EIL), may be selectively located under and/or over the organic emission layer.

The counter electrode 230 may be a light-transmitting electrode or a reflective electrode. In some embodiments, the counter electrode 230 may be a transparent or a semi-transparent electrode, and may include a metal thin film having a low work function including lithium (Li), calcium (Ca), LiF/Ca, LiF/Al, aluminum (Al), silver (Ag), magnesium (Mg), or a compound thereof. Also, a transparent conductive oxide (TCO) film including ITO, IZO, ZnO, or $In_2O_3$ may be further located on the metal thin film. The counter electrode 230 may be located over the display area DA, and may be located on the intermediate layer 220 and the pixel-defining film 121. The counter electrode 230 may be integrally formed with a plurality of organic light-emitting diodes OLED to correspond to a plurality of pixel electrodes 210.

Because the organic light-emitting diodes OLED may be damaged (e.g., may be easily damaged) by external moisture and/or oxygen, an encapsulation layer may cover and protect the organic light-emitting diodes OLED. The encapsulation layer may cover the display area DA, and may extend to at least a part of the peripheral area DPA. The encapsulation layer may include a first inorganic encapsulation layer, an organic encapsulation layer, and a second inorganic encapsulation layer.

Figure 7A:
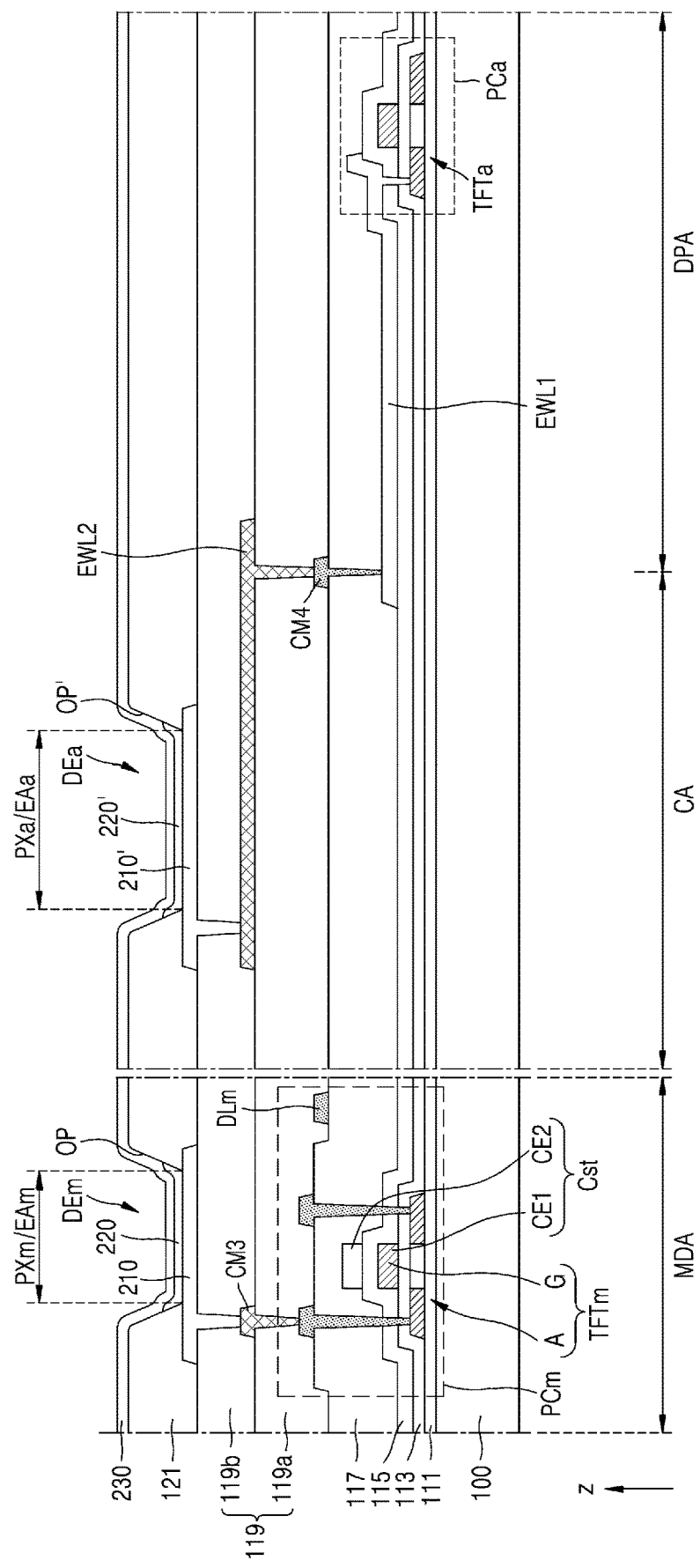
FIG. 7A is a cross-sectional view illustrating an electrode connection wiring according to an embodiment.
Figure 7B:
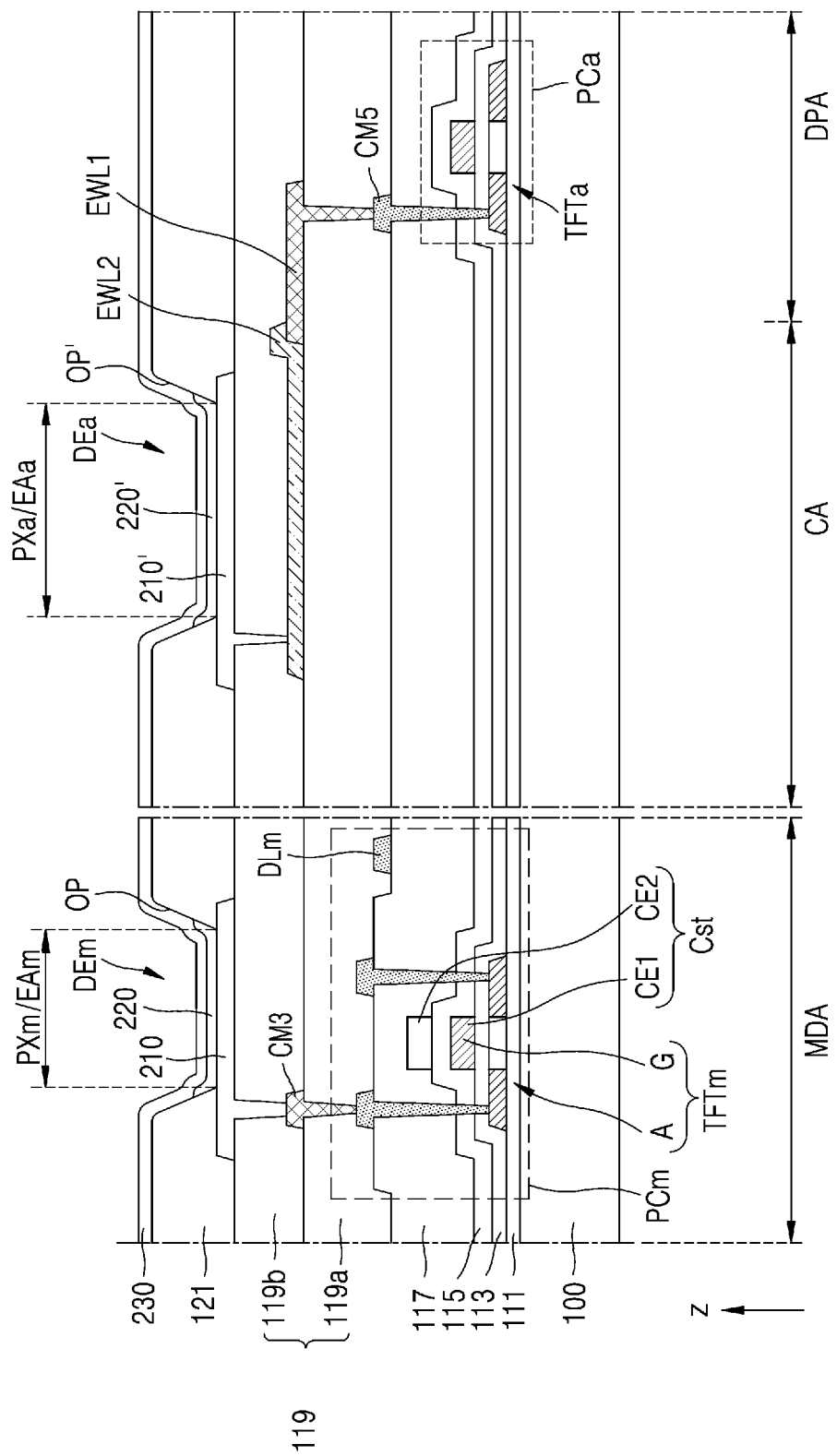
FIG. 7B is a cross-sectional view illustrating the electrode connection wiring according to another embodiment.

FIG. 7A is a cross-sectional view illustrating the electrode connection wiring EWL according to an embodiment. FIG. 7B is a cross-sectional view illustrating the electrode connection wiring EWL according to another embodiment. In FIGS. 7A and 7B, the same or substantially the same members, elements, and layers as those of FIGS. 5, 6A, and 6B are denoted by the same reference symbols, and thus, redundant description thereof may not be repeated.

Referring to FIGS. 7A and 7B, the main pixel PXm may be located at (e.g., in or on) the main display area MDA, and the auxiliary pixel PXa may be located at (e.g., in or on) the component area CA. The main pixel circuit PCm including the main thin-film transistor TFTm, and the main display element DEm connected to the main pixel circuit PCm may be located at (e.g., in or on) the main display area MDA. The auxiliary pixel circuit PCa including the auxiliary thin-film transistor TFTa may be located at (e.g., in or on) the peripheral area DPA, and the auxiliary display element DEa connected to the auxiliary pixel circuit PCa may be located at (e.g., in or on) the component area CA.

The auxiliary display element DEa connected to the auxiliary pixel circuit PCa is located on the planarization layer 119. The auxiliary display element DEa includes a second pixel electrode 210', a second intermediate layer 220' including an organic emission layer, and the counter electrode 230. The auxiliary display element DEa may be connected to the auxiliary thin-film transistor TFTa through the electrode connection wiring EWL, and contact holes formed in the planarization layer 119, the interlayer insulating layer 117, and the first and second gate insulating layers 113 and 115, respectively. In other words, the auxiliary display element DEa may be connected to the auxiliary pixel circuit PCa.

The pixel-defining film 121 located on the planarization layer 119 may cover an edge of the second pixel electrode 210', and may have a second opening OP' through which a central portion of the second pixel electrode 210' is exposed. An emission area EAa of the auxiliary display element DEa is defined by the second opening OP'. In other words, a size and a shape of the auxiliary pixel PXa are defined by the second opening OP'.

In an embodiment, the emission area EAm of the main display element DEm that emits light of a first color may be smaller than the emission area EAa of the auxiliary display element DEa that emits light of the first color. In other words, when sizes of the main pixel PXm and the auxiliary pixel PXa that emit light of the same color as each other are compared with each other, the size of the auxiliary pixel PXa may be greater than the size of the main pixel PXm.

In an embodiment, the first electrode connection wiring EWL1 and the second electrode connection wiring EWL2 may be located at (e.g., in or on) different layers from each other. For example, as shown in FIG. 7A, the first electrode connection wiring EWL1 may be located on the second gate insulating layer 115, and the second electrode connection wiring EWL2 may be located on the first planarization layer 119a. The first electrode connection wiring EWL1 and the second electrode connection wiring EWL2 may be connected to each other through a fourth connection electrode CM4 located on the interlayer insulating layer 117, and contact holes formed in the planarization layer 119 and the interlayer insulating layer 117, respectively. As another example, the first electrode connection wiring EWL1 may be located on the first gate insulating layer 113, the interlayer insulating layer 117, or the first planarization layer 119a. The second electrode connection wiring EWL2 may be located on the interlayer insulating layer 117.

In another embodiment, the first electrode connection wiring EWL1 and the second electrode connection wiring EWL2 may be located at (e.g., in or on) the same layer as each other. For example, as shown in FIG. 7B, the first electrode connection wiring EWL1 and the second electrode connection wiring EWL2 may be located on the first planarization layer 119a. An end of the second electrode connection wiring EWL2 may be provided to cover an end of the first electrode connection wiring EWL1. Accordingly, the first electrode connection wiring EWL1 and the second electrode connection wiring EWL2 may be connected to each other. The first electrode connection wiring EWL1 may be connected to the auxiliary thin-film transistor TFTa through a fifth connection electrode CM5 located on the interlayer insulating layer 117, and contact holes formed in the planarization layer 119, the interlayer insulating layer 117, and the first and second gate insulating layers 113 and 115, respectively.

Although the first electrode connection wiring EWL1 and the second electrode connection wiring EWL2 are shown in FIG. 7B as being located on the first planarization layer 119a, as another example, the first electrode connection wiring EWL1 and the second electrode connection wiring EWL2 may be located on the interlayer insulating layer 117.

The first electrode connection wiring EWL1 and the second electrode connection wiring EWL2 may include different materials from each other. For example, the first electrode connection wiring EWL1 may include a conductive material including molybdenum (Mo), aluminum (Al), copper (Cu), or titanium (Ti), and may have a single-layer structure or a multi-layered structure including one or more of the above materials. The second electrode connection wiring EWL2 may include a transparent conductive material. For example, the second electrode connection wiring EWL2 may include a transparent conductive oxide (TCO). The second electrode connection wiring EWL2 may include a conductive oxide, for example, such as indium tin oxide (ITO), indium zinc oxide (IZO), zinc oxide (ZnO), indium oxide ($In_2O_3$), indium gallium oxide (IGO), or aluminum zinc oxide (AZO).

Figure 8:
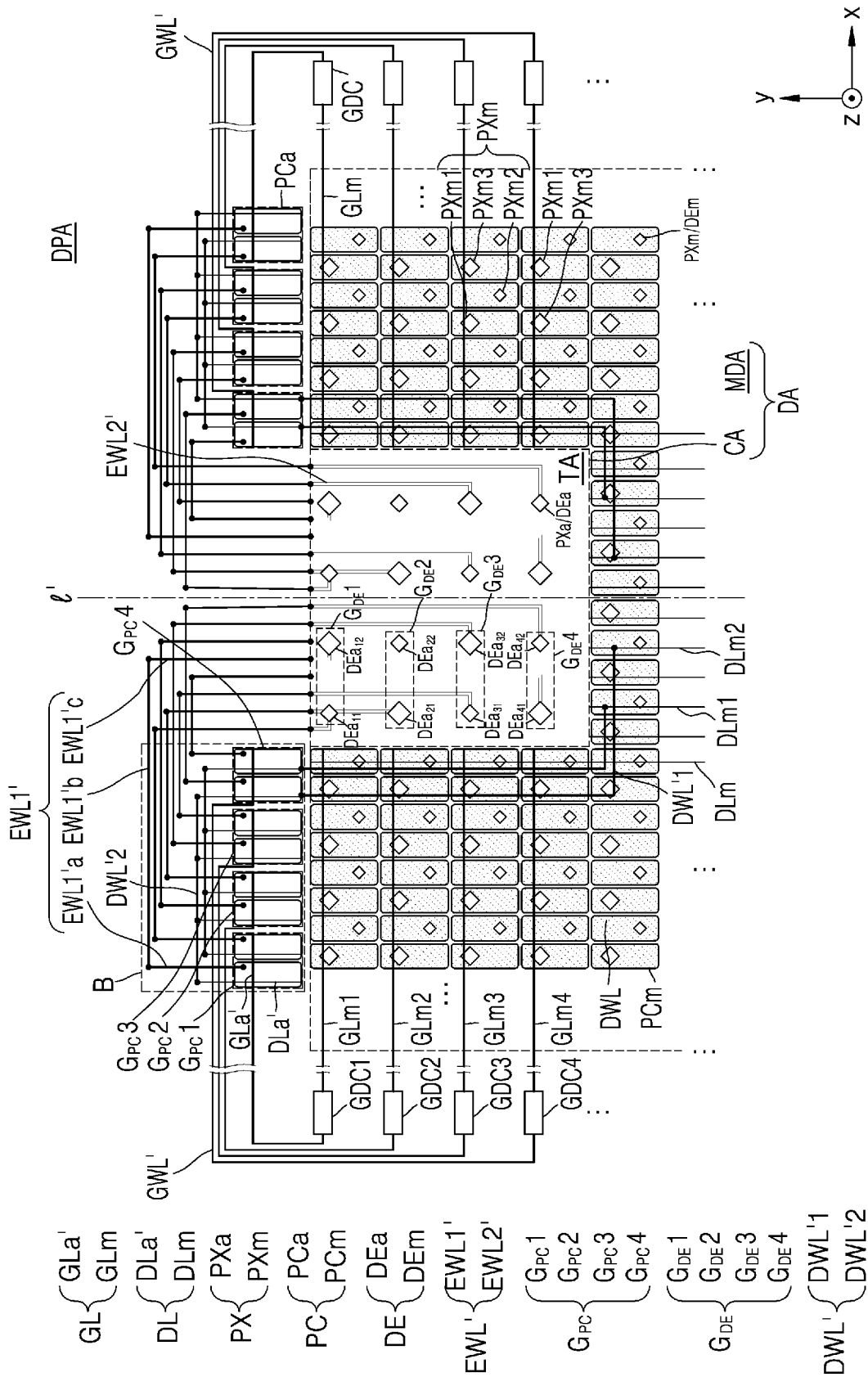
FIG. 8 is a plan view illustrating a portion of the display panel according to another embodiment.
Figure 9:
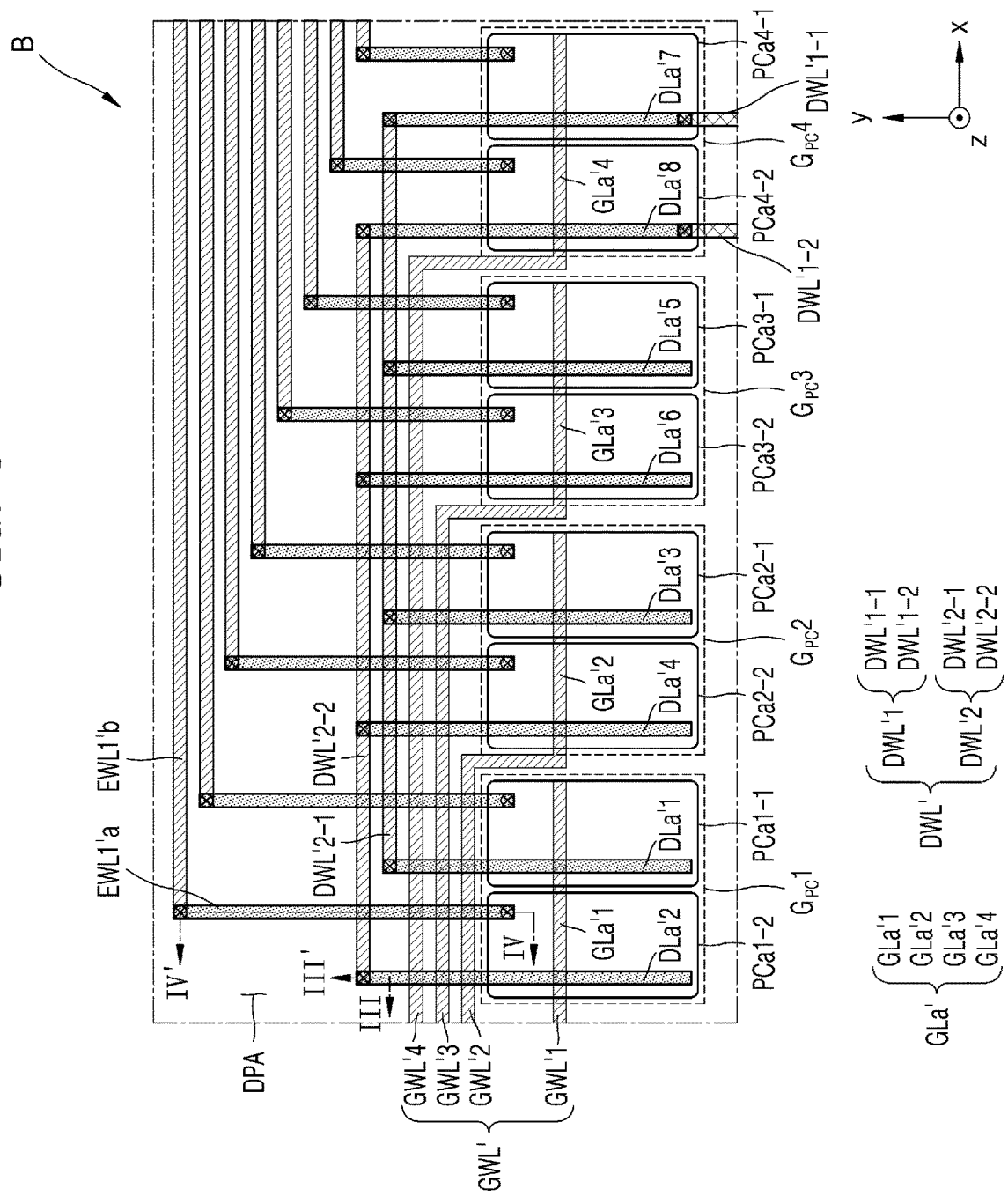
FIG. 9 is an enlarged plan view illustrating a peripheral area of FIG. 8.
Figure 10:
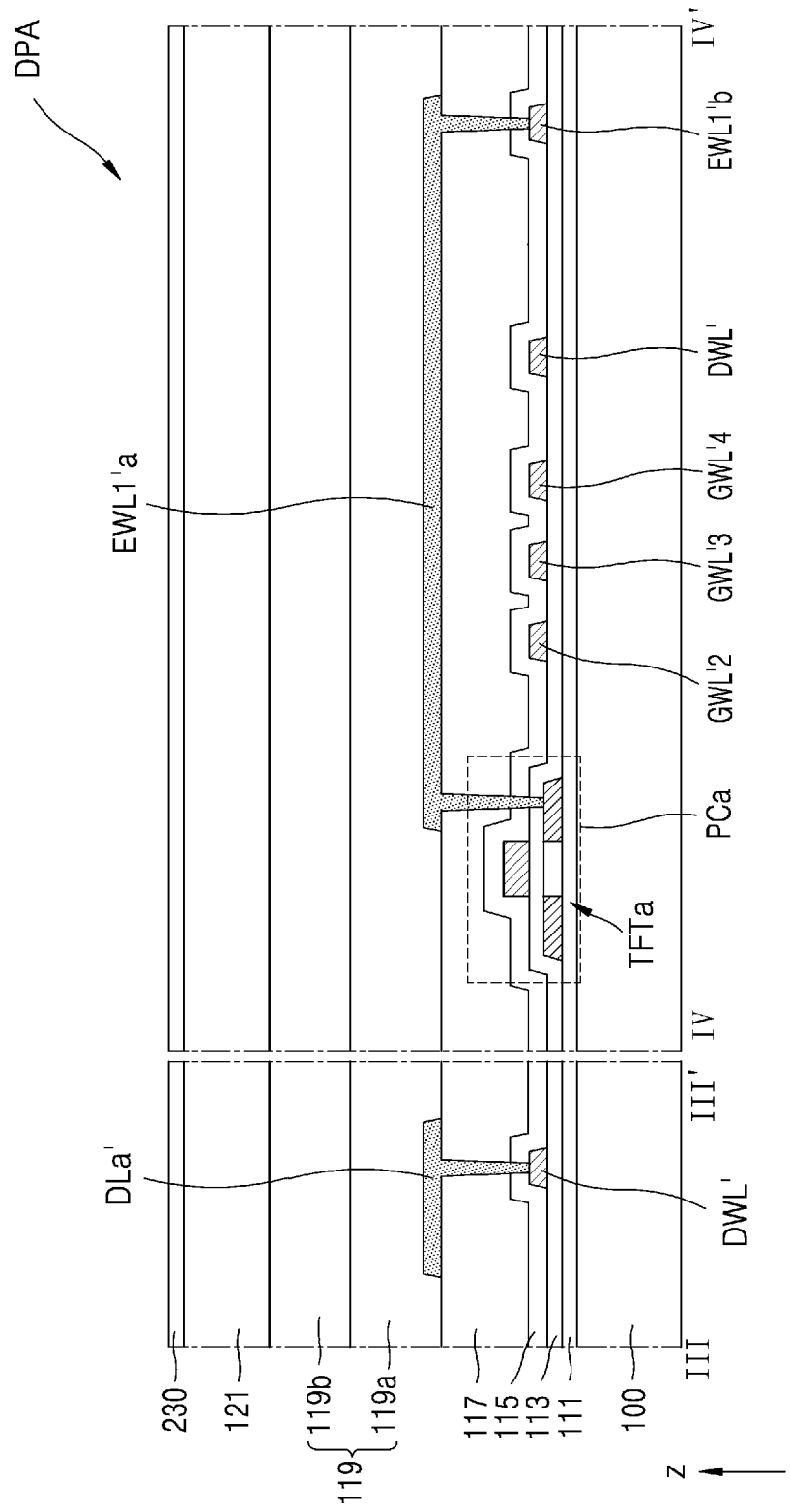
FIG. 10 is a cross-sectional view taken along the lines III-III' and IV-IV' of FIG. 9, and shows a gate connection wiring, a data connection wiring, and an electrode connection wiring.

FIG. 8 is a plan view illustrating a portion of the display panel 10 according to another embodiment. FIG. 9 is an enlarged plan view illustrating the peripheral area DPA of FIG. 8. FIG. 10 is a cross-sectional view taken along the lines III-III' and IV-IV' of FIG. 9, and shows the gate connection wiring GWL', the data connection wiring DWL', and the electrode connection wiring EWL'. In FIGS. 8, 9, and 10, the same or substantially the same members, elements, and layers as those of FIGS. 5, 6A, and 6B are denoted by the same reference symbols, and thus, redundant description thereof may not be repeated.

Referring to FIG. 8, the auxiliary pixel circuits PCa for implementing light emission of the auxiliary pixels PXa may be located at (e.g., in or on) the peripheral area DPA. The auxiliary pixel circuits PCa may be located at (e.g., in or on) the peripheral area DPA that is adjacent to the main display area MDA, and may be arranged along the x-direction. In other words, the auxiliary pixel circuits PCa may be located in the same row as each other. Because the auxiliary pixel circuits PCa are not located at (e.g., in or on) the component area CA, the component area CA may secure a wider transmissive area TA.

The auxiliary pixel circuits PCa may be connected to the auxiliary display elements DEa, respectively, through the electrode connection wirings EWL'. The plurality of auxiliary pixel circuits PCa that are located at (e.g., in or on) the left side of a virtual line ℓ', which passes or substantially passes through the center of the display panel 10 in the y-direction, and the plurality of auxiliary pixel circuits PCa that are located on the right side of the virtual line ℓ' may be symmetric or substantially symmetric with each other relative to the virtual line ℓ'. Also, the plurality of electrode connection wirings EWL' that are located at (e.g., in or on) the left side of the virtual line ℓ' and the plurality of electrode connection wirings EWL' that are located at (e.g., in or on) the right side of the virtual line ℓ' may be symmetric or substantially symmetric with each other relative to the virtual line ℓ'.

Although the plurality of auxiliary pixel circuits PCa and the plurality of electrode connection wirings EWL' located at (e.g., in or on) the left side of the virtual line ℓ' are described in more detail, the same or substantially the same description may be applied to the plurality of auxiliary pixel circuits PCa and the plurality of electrode connection wiring EWL' located at (e.g., in or on) the right side of the virtual line ℓ'.

The plurality of auxiliary pixel circuits PCa may be divided into a plurality of pixel circuit groups $G_{PC}$. The plurality of auxiliary display elements DEa may be divided into a plurality of display element groups $G_{DE}$ that are connected to the plurality of pixel circuit groups $G_{PC}$, respectively. In this case, each of the plurality of display element groups $G_{DE}$ may be a set of auxiliary display elements that are located in the same row as each other from among the plurality of auxiliary display elements DEa. In other words, the plurality of auxiliary display elements DEa may be grouped in units of the rows. The auxiliary display elements DEa grouped in the same unit of the rows may be connected to the auxiliary pixel circuits PCa, respectively, included in the same pixel circuit group $G_{PC}$.

For example, the plurality of auxiliary pixel circuits PCa may be divided into a first pixel circuit group $G_{PC}1$, a second pixel circuit group $G_{PC}2$, a third pixel circuit group $G_{PC}3$, and a fourth pixel circuit group $G_{PC}4$. The plurality of auxiliary display elements DEa may be divided into a first display element group $G_{DE}1$, a second display element group $G_{DE}2$, a third display element group $G_{DE}3$, and a fourth display element group $G_{DE}4$. The first display element group $G_{DE}1$ may be connected to the first pixel circuit group $G_{PC}1$, the second display element group $G_{DE}2$ may be connected to the second pixel circuit group $G_{PC}2$, the third display element group $G_{DE}3$ may be connected to the third pixel circuit group $G_{PC}3$, and the fourth display element group $G_{DE}4$ may be connected to the fourth pixel circuit group $G_{PC}4$. In this case, the first display element group $G_{DE}1$ may be a set of auxiliary display elements located in a first row from among the plurality of auxiliary display elements DEa, the second display element group $G_{DE}2$ may be a set of auxiliary display elements located in a second row from among the plurality of auxiliary display elements DEa, the third display element group $G_{DE}3$ may be a set of auxiliary display elements located in a third row from among the plurality of auxiliary display elements DEa, and the fourth display element group $G_{DE}4$ may be a set of auxiliary display elements located in a fourth row from among the plurality of auxiliary display elements DEa. In other words, the first display element group $G_{DE}1$ may include an auxiliary display element $DEa_{11}$ located in the first row and a first column, and an auxiliary display element $DEa_{12}$ located in the first row and a second column. The second display element group $G_{DE}2$ may include an auxiliary display element $DEa_{21}$ located in a second row and the first column, and an auxiliary display element $DEa_{22}$ located in the second row and the second column. The third display element group $G_{DE}3$ may include an auxiliary display element $DEa_{31}$ located in a third row and the first column, and an auxiliary display element $DEa_{32}$ located in the third row and the second column. The fourth display element group $G_{DE}4$ may include an auxiliary display element $DEa_{41}$ located in a fourth row and the first column, and an auxiliary display element $DEa_{42}$ located in the fourth row and the second column.

The number of the auxiliary pixel circuits PCa included in the pixel circuit group $G_{PC}$ may be the same as the number of the auxiliary display elements DEa included in the display element group $G_{DE}$. For example, as shown in FIG. 8, when two auxiliary display elements DEa are located in the display element group $G_{DE}$, two auxiliary pixel circuits PCa may be included in the pixel circuit group $G_{PC}$.

A pixel circuit group connected to a display element group that is a set of auxiliary display elements located in an $n^{th}$ row at (e.g., in or on) the component area CA may be farther from the component area CA than a pixel circuit group connected to a display element group that is a set of auxiliary display elements located in an $n+1^{th}$ row. Here, n is a positive integer.

For example, as shown in FIG. 8, the first pixel circuit group $G_{PC}1$ connected to the first display element group $G_{DE}1$ that is a set of auxiliary display elements located in the first row at (e.g., in or on) the component area CA may be farther from the component area CA than the second pixel circuit group $G_{PC}2$ connected to the second display element group $G_{DE}2$ that is a set of auxiliary display elements located in the second row. The second pixel circuit group $G_{PC}2$ connected to the second display element group $G_{DE}2$ that is a set of auxiliary display elements located in the second row at (e.g., in or on) the component area CA may be farther from the component area CA than the third pixel circuit group $G_{PC}3$ connected to the third display element group $G_{DE}3$ that is a set of auxiliary display elements located in the third row. Also, the third pixel circuit group $G_{PC}3$ connected to the third display element group $G_{DE}3$ that is a set of auxiliary display elements located in the third row at (e.g., in or on) the component area CA may be farther from the component area CA than the fourth pixel circuit group $G_{PC}4$ connected to the fourth display element group $G_{DE}4$ that is a set of auxiliary display elements located in the fourth row. In other words, the first pixel circuit group $G_{PC}1$ connected to the first display element group $G_{DE}1$ may be farthest from the component area CA.

The auxiliary pixel circuits PCa included in the pixel circuit group $G_{PC}$ may be connected to the auxiliary display elements DEa, respectively, in an order of adjacency of the auxiliary pixel circuits PCa to the component area CA. In this case, the auxiliary display elements DEa may be connected to the auxiliary pixel circuits PCa, respectively, in an order of adjacency of the auxiliary display elements DEa to a boundary between the main display area MDA and the component area CA.

For example, as shown in FIGS. 8 and 9, the first pixel circuit group $G_{PC}1$ may include a $1\text{-}1^{th}$ auxiliary pixel circuit PCa1-1 and a $1\text{-}2^{th}$ auxiliary pixel circuit PCa1-2. The $1\text{-}1^{th}$ auxiliary pixel circuit PCa1-1 may be closer to the component area CA than the $1\text{-}2^{th}$ auxiliary pixel circuit PCa1-2. The $1\text{-}1^{th}$ auxiliary pixel circuit PCa1-1 that is adjacent to (e.g., closer to) the component area CA may be connected to the auxiliary display element $DEa_{11}$ located in the first row and the first column that is adjacent to (e.g., closer to) the boundary between the main display area MDA and the component area CA. The $1\text{-}2^{th}$ auxiliary pixel circuit PCa1-2 may be connected to the auxiliary display element $DEa_{12}$ located in the first row and the second column that is farther from the boundary between the main display area MDA and the component area CA than the auxiliary display element $DEa_{11}$ located in the first row and the first column. Although the first pixel circuit group $G_{PC}1$ is described in more detail, the same or substantially the same description may be applied to the other pixel circuit groups $G_{PC}$.

Each of the electrode connection wirings EWL may include a first electrode connection wiring EWL1' located at (e.g., in or on) the peripheral area DPA, and a second electrode connection wiring EWL2' located at (e.g., in or on) the component area CA. The first electrode connection wiring EWL1' may extend in the x-direction and the y-direction, and the second electrode connection wiring EWL2' may also extend in the x-direction and the y-direction.

One end of the first electrode connection wiring EWL1' may be connected to the auxiliary pixel circuit PCa, and the other end of the first electrode connection wiring EWL1' may be connected to the second electrode connection wiring EWL2'. The first electrode connection wiring EWL1' may include a first portion EWL1'a extending in the y-direction, a second portion EWL1'b extending in the x-direction, and a third portion EWL1'c extending in the y-direction. The first electrode connection wiring EWL1' may include a conductive material including molybdenum (Mo), aluminum (Al), copper (Cu), or titanium (Ti), and may have a single-layer structure or a multi-layered structure including one or more of the above materials.

In an embodiment, the first portion EWL1'a, the second portion EWL1'b, and the third portion EWL1'c may be located at (e.g., in or on) different layers from one another. When the first portion EWL1'a, the second portion EWL1'b, and the third portion EWL1'c are located at (e.g., in or on) different layers from one another, the first portion EWL1'a, the second portion EWL1'b, and the third portion EWL1'c may be connected to one another through contact holes. For example, as shown in FIG. 10, the first portion EWL1'a may be located on the interlayer insulating layer 117, and the second portion EWL1'b may be located on the first gate insulating layer 113. As another example, the first portion EWL1'a may be located on the first planarization layer 119a. The second portion EWL1'b may be located on the second gate insulating layer 115. In another embodiment, the first portion EWL1'a and the third portion EWL1'c may be located at (e.g., in or on) the same layer as each other.

One end of the second electrode connection wiring EWL2' may be connected to the first electrode connection wiring EWL1', and the other end of the second electrode connection wiring EWL2' may be connected to the auxiliary display element DEa. As shown in FIG. 8, one end of the second electrode connection wiring EWL2' may be connected to the first electrode connection wiring EWL1' at an edge of the component area CA. The second electrode connection wiring EWL2' may include a transparent conductive material.

As described above with reference to FIGS. 7A and 7B, the first electrode connection wiring EWL1' and the second electrode connection wiring EWL2' may be located at (e.g., in or on) the same layer as each other, or may be located at (e.g., in or on) different layers from each other. When the first electrode connection wiring EWL1' and the second electrode connection wiring EWL2' are located at (e.g., in or on) different layers from each other, the first electrode connection wiring EWL1' and the second electrode connection wiring EWL2' may be connected to each other through a contact hole.

The gate line GL may include the main gate line GLm connected to the main pixel circuits PCm, and an auxiliary gate line GLa' connected to the auxiliary pixel circuits PCa.

The auxiliary gate line GLa' may be connected to the main gate line GLm through the gate connection wiring GWL'. The auxiliary gate line GLa' may be connected to the main gate line GLm that is disconnected by the component area CA from among the main gate lines GLm through the gate connection wiring GWL'. The auxiliary gate line GLa' may be connected to the main gate line GLm that is adjacent to the component area CA in the x-direction from among the main gate lines GLm through the gate connection wiring GWL'. For example, each of the auxiliary gate lines GLa' may be connected to the first main gate line GLm1, the second main gate line GLm2, the third main gate line GLm3, and the fourth main gate line GLm4 that are adjacent to the component area CA in the x-direction from among the main gate lines GLm.

As described above with reference to FIG. 3, the plurality of gate driving circuits GDC that are connected to the plurality of main gate lines GLm, respectively, may be located at (e.g., in or on) a side portion of the peripheral area DPA. The gate connection wirings GWL' may be connected to the gate driving circuits GDC, respectively, that are connected to the main gate lines GLm adjacent to the component area CA in the x-direction from among the plurality of gate driving circuits GDC. In this case, the main gate lines GLm may extend from the gate driving circuits GDC, respectively, to the main display area MDA. In other words, the main gate lines GLm may respectively extend from the gate driving circuits GDC in the +x direction. The gate connection wirings GWL' may respectively extend from the gate driving circuits GDC to the peripheral area DPA. In other words, the gate connection wirings GWL' may respectively extend from the gate driving circuits GDC in the −x direction.

For example, as shown in FIG. 8, the first main gate line GLm1 that is adjacent to the component area CA in the x-direction may be connected to the first gate driving circuit GDC1, and may extend from the first gate driving circuit GDC1 to the main display area MDA. The gate connection wiring GWL' may be connected to the first gate driving circuit GDC1, and may extend from the first gate driving circuit GDC1 to the peripheral area DPA. The gate connection wiring GWL' may be connected to the first main gate line GLm1 through the first gate driving circuit GDC1. Although the first main gate line GLm1 is described in more detail, the same or substantially the same description may be applied to the second through fourth main gate lines GLm2, GLm3, and GLm4.

The number of the main gate lines GLm that are connected to the auxiliary gate line GLa' may be the same as the number of the auxiliary pixels PXa located at (e.g., in or on) the component area CA and arranged along the y-direction. For example, as shown in FIG. 8, when the number of the auxiliary pixels PXa located at (e.g., in or on) the component area CA and arranged along the y-direction is 4, the number of the main gate lines GLm connected to the auxiliary gate line GLa' may be 4.

The gate connection wiring GWL' may extend in the x-direction and the y-direction, and may be connected to the auxiliary gate line GLa'. In an embodiment, the gate connection wiring GWL' and the auxiliary gate line GLa' may be integrally formed. The gate connection wiring GWL' may be located on the first gate insulating layer 113 as shown in FIG. 10.

Referring to FIG. 9, in an embodiment, the auxiliary gate lines GLa' that are connected to the same pixel circuit group $G_{PC}$ from among the plurality of auxiliary gate lines GLa' may be connected to one another. In other words, the auxiliary pixel circuits PCa included in one pixel circuit group $G_{PC}$ from among the plurality of pixel circuit groups $G_{PC}$ may share the auxiliary gate line GLa' with each other. The plurality of auxiliary gate lines GLa' may be connected in a one-to-one manner to the plurality of pixel circuit groups $G_{PC}$.

For example, the first auxiliary gate line GLa'1 may be connected to the 1-1$^{th}$ auxiliary pixel circuit PCa1-1 and the 1-2$^{th}$ auxiliary pixel circuit PCa1-2 included in the first pixel circuit group $G_{PC}$1. In other words, the 1-1$^{th}$ auxiliary pixel circuit PCa1-1 and the 1-2$^{th}$ auxiliary pixel circuit PCa1-2 included in the first pixel circuit group $G_{PC}$1 may share the first auxiliary gate line GLa'1 with each other.

A second auxiliary gate line GLa'2 may be connected to the 2-1$^{th}$ auxiliary pixel group PCa2-1 and the 2-2$^{th}$ auxiliary pixel circuit PCa2-2 included in the second pixel circuit group $G_{PC}$2. In other words, the 2-1$^{th}$ auxiliary pixel group PCa2-1 and the 2-2$^{th}$ auxiliary pixel circuit PCa2-2 included in the second pixel circuit group $G_{PC}2$ may share the second auxiliary gate line GLa'2 with each other.

A third auxiliary gate line GLa'3 may be connected to a 3-1$^{th}$ auxiliary pixel circuit PCa3-1 and a 3-2$^{th}$ auxiliary pixel circuit PCa3-2 included in the third pixel circuit group $G_{PC}3$. In other words, the 3-1$^{th}$ auxiliary pixel circuit PCa3-1 and the 3-2$^{th}$ auxiliary pixel circuit PCa3-2 included in the third pixel circuit group $G_{PC}3$ may share the third auxiliary gate line GLa'3 with each other.

A fourth auxiliary gate line GLa'4 may be connected to a 4-1$^{th}$ auxiliary pixel circuit PCa4-1 and a 4-2$^{th}$ auxiliary pixel circuit PCa4-2 included in the fourth pixel circuit group $G_{PC}4$. In other words, the 4-1$^{th}$ auxiliary pixel circuit PCa4-1 and the 4-2$^{th}$ auxiliary pixel circuit PCa4-2 included in the fourth pixel circuit group $G_{PC}4$ may share the fourth auxiliary gate line GLa'4 with each other.

In this case, as shown in FIG. 8, the 1-1$^{th}$ auxiliary pixel circuit PCa1-1 may be connected to the auxiliary display element DEa$_{11}$ located in the first row and the first column at (e.g., in or on) the component area CA, and the 1-2$^{th}$ auxiliary pixel circuit PCa1-2 may be connected to the auxiliary display element DEa$_{12}$ located in the first row and the second column at (e.g., in or on) the component area CA. In other words, because the auxiliary gate lines GLa' that are respectively connected to the auxiliary pixel circuits PCa for driving the auxiliary display elements DEa located in the same row as each other may be connected to one another, the same signal may be applied to the auxiliary pixel circuits PCa for driving the auxiliary display element DEa that are located in the same row as each other. Also, because the gate connection wiring GWL' that is connected to the first auxiliary gate line GLa'1 may be connected to the first main gate line GLm1 through the first gate driving circuit GDC1, the same signal may be applied to the pixel circuits PC for driving the main display element DEm and the auxiliary display element DEa located in the same row as each other. Although the 1-1$^{th}$ auxiliary pixel circuit PCa1-1 and the 1-2$^{th}$ auxiliary pixel circuit PCa1-2 included in the first pixel circuit group $G_{PC}1$ are described in more detail, the same or substantially the same description may be applied to the other auxiliary pixel circuits PCa.

Referring again to FIG. 8, the data line DL may include the main data line DLm connected to the main pixel circuits PCm, and the auxiliary data line DLa' connected to the auxiliary pixel circuits PCa.

The auxiliary data line DLa' may be connected to the main data line DLm through the data connection wiring DWL'. The auxiliary data line DLa' may be connected to the main data line DLm that is disconnected by the component area CA from among the main data lines DLm through the data connection wiring DWL'. The auxiliary data line DLa' may be connected to the main data line DLm that is adjacent to the component area CA in the y-direction from among the main data lines DLm through the data connection wiring DWL'. For example, each of the auxiliary data lines DLa' may be connected to the first main data line DLm1 and the second main data line DLm2 that are adjacent to the component area CA in the y-direction from among the main data lines DLm. Although each of the auxiliary data lines DLa' is connected to the first main data line DLm1 and the second main data line DLm2 in FIG. 8, each of the auxiliary data line DLa' may be connected to any suitable one of the main data lines DLm that are disconnected by the component area CA.

The data connection wiring DWL' may include a first data connection wiring DWL'1 that connects the auxiliary data line DLa' to the main data line DLm, and a second data connection wiring DWL'2 that connects the auxiliary data lines DLa' to one another. The data connection wiring DWL' and the auxiliary data line DLa' may be located at (e.g., in or on) different layers from each other, and the data connection wiring DWL' may be connected to the auxiliary data line DLa' through contact holes. In an embodiment, as shown in FIG. 10, the data connection wiring DWL' may be located on the first gate insulating layer 113, and the auxiliary data line DLa' may be located on the interlayer insulating layer 117. As another example, the data connection wiring DWL' may be located on the second gate insulating layer 115. The auxiliary data line DLa' may be located on the first planarization layer 119a.

The first data connection wiring DWL'1 may extend in the x-direction and the y-direction, to connect the main data line DLm to the auxiliary data line DLa'. The first data connection wiring DWL'1 may have a shape that is bent at least one time. The first data connection wiring DWL'1 may be located to bypass (e.g., to extend around) the component area CA. The first data connection wiring DWL'1 may overlap with the main pixel circuits PCm located at (e.g., in or on) the main display area MDA. As the first data connection wiring DW1L is located at (e.g., in or on) the main display area MDA, a separate space in which the first data connection wiring DWL'1 is located may not be used or needed, thereby minimizing or reducing a size of a dead space.

Any suitable one of the plurality of pixel circuit groups $G_{PC}$ may be connected to the first data connection wiring DWL'1 that is connected to the main data line DLm. For example, as shown in FIG. 9, a 1-1$^{th}$ data connection wiring DWL'1-1 and a 1-2$^{th}$ data connection wiring DWL'1-2 that are connected to the main data line DLm may be connected to the fourth pixel circuit group $G_{PC}4$. The 1-1$^{th}$ data connection wiring DWL'1-1 may be connected to a seventh auxiliary data line DLa'7 that is connected to the 4-1$^{th}$ auxiliary pixel circuit PCa4-1, and the 1-2$^{th}$ data connection wiring DWL'1-2 may be connected to an eighth auxiliary data line DLa'8 that is connected to the 4-2$^{th}$ auxiliary pixel circuit PCa4-2.

Although the 1-1$^{th}$ data connection wiring DWL'1-1 and the 1-2$^{th}$ data connection wiring DWL'1-2 are connected to the fourth pixel circuit group $G_{PC}4$ in FIG. 9, the 1-1$^{th}$ data connection wiring DWL'1-1 and the 1-2$^{th}$ data connection wiring DWL'1-2 may be connected to at least one of the first pixel circuit group $G_{PC}1$, the second pixel circuit group $G_{PC}2$, the third pixel circuit group $G_{PC}3$, and/or the fourth pixel circuit group $G_{PC}4$. For example, the 1-1$^{th}$ data connection wiring DWL'1-1 and the 1-2$^{th}$ data connection wiring DWL'1-2 may be connected to the first pixel circuit group $G_{PC}1$, or may be connected to the first pixel circuit group $G_{PC}1$ and the third pixel circuit group $G_{PC}3$.

Referring to FIG. 9, in an embodiment, the auxiliary data lines DLa' that are respectively connected to different pixel circuit groups $G_{PC}$ from each other from among the plurality of auxiliary data lines DLa' may be connected to one another. The auxiliary data lines DLa that are respectively connected to different pixel circuit groups $G_{PC}$ from each other from among the plurality of auxiliary data lines DLa' may be connected to one another through the second data connection wiring DWL'2.

For example, a first auxiliary data line DLa'1 may be connected to the 1-1$^{th}$ auxiliary pixel circuit PCa1-1 included in the first pixel circuit group $G_{PC}1$, a third auxiliary data line DLa'3 may be connected to the 2-1$^{th}$ auxiliary pixel circuit PCa2-1 included in the second pixel circuit group $G_{PC}2$, a fifth auxiliary data line DLa'5 may be connected to the 3-1$^{th}$ auxiliary pixel circuit PCa3-1 included in the third pixel circuit group $G_{PC}3$, and the seventh auxiliary data line DLa'7 may be connected to the 4-1$^{th}$ auxiliary pixel circuit PCa4-1 included in the fourth pixel circuit group $G_{PC}4$. The first auxiliary data line DLa'1, the third auxiliary data line DLa'3, the fifth auxiliary data line DLa'5, and the seventh auxiliary data line DLa'7 that are respectively connected to different pixel circuit groups $G_{PC}$ from each other may be connected to one another. The first auxiliary data line DLa'1, the third auxiliary data line DLa'3, the fifth auxiliary data line DLa'5, and the seventh auxiliary data line DLa'7 may be connected to one another through a 2-1$^{th}$ data connection wiring DWL'2-1.

A second auxiliary data line DLa'2 may be connected to the 1-2$^{th}$ auxiliary pixel circuit PCa1-2 included in the first pixel circuit group $G_{PC}1$, a fourth auxiliary data line DLa'4 may be connected to the 2-2$^{th}$ auxiliary pixel circuit PCa2-2 included in the second pixel circuit group $G_{PC}2$, a sixth auxiliary data line DLa'6 may be connected to the 3-2$^{th}$ auxiliary pixel circuit PCa3-2 included in the third pixel circuit group $G_{PC}3$, and the eighth auxiliary data line DLa'8 may be connected to the 4-2$^{th}$ auxiliary pixel circuit PCa4-2 included in the fourth pixel circuit group $G_{PC}4$. The second auxiliary data line DLa'2, the fourth auxiliary data line DLa'4, the sixth auxiliary data line DLa'6, and the eighth auxiliary data line DLa'8 that are respectively connected to different pixel circuit groups $G_{PC}$ from each other may be connected to one another. The second auxiliary data line DLa'2, the fourth auxiliary data line DLa'4, the sixth auxiliary data line DLa'6, and the eighth auxiliary data line DLa'8 may be connected to one another through a 2-2$^{th}$ data connection wiring DWL'2-2.

In this case, as shown in FIG. 8, the 1-1$^{th}$ auxiliary pixel circuit PCa1-1 may be connected to the auxiliary display element DEa$_{11}$ located in the first row and the first column at (e.g., in or on) the component area CA, the 2-1$^{th}$ auxiliary pixel circuit PCa2-1 may be connected to the auxiliary display element DEa$_{21}$ located in the second row and the first column at (e.g., in or on) the component area CA, the 3-1$^{th}$ auxiliary pixel circuit PCa3-1 may be connected to the auxiliary display element DEa$_{31}$ located in the third row and the first column at (e.g., in or on) the component area CA, and the 4-1$^{th}$ auxiliary pixel circuit PCa4-1 may be connected to the auxiliary display element DEa$_{41}$ located in the fourth row and the first column at (e.g., in or on) the component area CA. In other words, because the auxiliary data lines DLa' that are respectively connected to the auxiliary pixel circuits PCa for driving the auxiliary display element DEa that are located in the same column as each other may be connected to one another, the same signal may be applied to the auxiliary pixel circuits PCa for driving the auxiliary display element DEa that are located in the same column as each other. Also, because the auxiliary data lines DLa' that are respectively connected to the auxiliary pixel circuits PCa for driving the auxiliary display element DEa that are located in the same column as each other may be connected to the first main data line DLm1 through the data connection wiring DWL', the same signal may be applied to the pixel circuits PC for driving the main display element DEm and the auxiliary display elements DEa that are located in the same column as each other. Although the 1-1$^{th}$ auxiliary pixel circuit PCa1-1, the 2-1$^{th}$ auxiliary pixel circuit PCa2-1, the 3-1$^{th}$ auxiliary pixel circuit PCa3-1, and the 4-1$^{th}$ auxiliary pixel circuit PCa4-1 are described in more detail, the same or substantially the same description may be applied to the other auxiliary pixel circuits PCa.

Although the elements in FIG. 8 are shown to be symmetric with each other relative to the virtual line ℓ', the present disclosure is not limited thereto, and the auxiliary pixel circuits PCa that are located at (e.g., in or on) the right side of the virtual line ℓ' may all be located at (e.g., in or on) the left side of the virtual line ℓ'. As another example, the auxiliary pixel circuits PCa that are located at (e.g., in or on) the left side of the virtual line ℓ' may all be located at (e.g., in or on) the right side of the virtual line ℓ'.

Although the display panel and the display apparatus have been mainly described, the present disclosure is not limited thereto. For example, a method of manufacturing the display panel and a method of manufacturing the display apparatus may also be included within the scope of the present disclosure.

According to the one or more embodiments of the present disclosure, because a pixel circuit may not be located at (e.g., in or on) a component area, a wider transmissive area may be secured. Thus, a display panel having a higher transmittance, and a display apparatus including the display panel, may be provided. However, the present disclosure is not limited by such aspects and features.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display panel comprising:
   a substrate comprising:
      a display area comprising a main display area, and a component area; and
      a peripheral area outside the display area;
   a plurality of main pixel circuits at the main display area;
   a plurality of main gate lines extending in a first direction, and connected to main pixel circuits that are in a same row as each other from among the plurality of main pixel circuits;
   a plurality of main data lines extending in a second direction crossing the first direction, and connected to main pixel circuits that are in a same column as each other from among the plurality of main pixel circuits;
   a plurality of auxiliary display elements at the component area, and located along the first direction and the second direction;
   a plurality of auxiliary pixel circuits at the peripheral area adjacent to the main display area, the plurality of auxiliary pixel circuits being located in a same row as each other, and connected to the plurality of auxiliary display elements, respectively;

a plurality of auxiliary gate lines connected to the plurality of auxiliary pixel circuits, respectively, and to main gate lines that are adjacent to the component area in the first direction from among the plurality of main gate lines; and a plurality of auxiliary data lines connected to the plurality of auxiliary pixel circuits, respectively, and to main data lines that are adjacent to the component area in the second direction from among the plurality of main data lines.

2. The display panel of claim 1, wherein:
the plurality of auxiliary pixel circuits is divided into a plurality of pixel circuit groups;
the plurality of auxiliary display elements is divided into a plurality of display element groups that is connected to the plurality of pixel circuit groups, respectively; and
each of the plurality of display element groups comprises a set of auxiliary display elements, the auxiliary display elements of the set of auxiliary display elements being located in a same column as each other from among the plurality of auxiliary display elements.

3. The display panel of claim 2, wherein auxiliary data lines that are connected to a same pixel circuit group from among the plurality of auxiliary data lines are connected to one another.

4. The display panel of claim 2, wherein auxiliary gate lines that are connected to different pixel circuit groups from each other from among the plurality of auxiliary gate lines are connected to one another.

5. The display panel of claim 2, wherein a number of the auxiliary pixel circuits included in each of the plurality of pixel circuit groups is the same as a number of the auxiliary display elements included in each of the plurality of display element groups.

6. The display panel of claim 2, wherein:
the plurality of display element groups comprises a first display element group comprising a set of auxiliary display elements that is located in an $n^{th}$ column at the component area, and a second display element group comprising a set of auxiliary display elements that is located in an n+1th column at the component area, n being a positive integer;
the plurality of pixel circuit groups comprises a first pixel circuit group that is connected to the first display element group, and a second pixel circuit group that is connected to the second display element group; and
a distance between the first display element group and the first pixel circuit group is less than a distance between the second display element group and the second pixel circuit group.

7. The display panel of claim 1, wherein:
the plurality of auxiliary pixel circuits is divided into a plurality of pixel circuit groups;
the plurality of auxiliary display elements is divided into a plurality of display element groups that is connected to the plurality of pixel circuit groups, respectively; and
each of the plurality of display element groups comprises a set of auxiliary display elements, the auxiliary display elements of the set of auxiliary display elements being located in a same row as each other from among the plurality of auxiliary display elements.

8. The display panel of claim 7, wherein auxiliary data lines that are connected to different pixel circuit groups from each other from among the plurality of auxiliary data lines are connected to one another.

9. The display panel of claim 7, wherein auxiliary gate lines that are connected to a same pixel circuit group as each other from among the plurality of auxiliary gate lines are connected to one another.

10. The display panel of claim 7, wherein the plurality of auxiliary gate lines is connected one-to-one to the plurality of pixel circuit groups, and is shared by the auxiliary pixel circuits that are included in each of the plurality of pixel circuit groups.

11. The display panel of claim 7, wherein:
the plurality of display element groups comprises a first display element group comprising a set of auxiliary display elements that is located in an $n^{th}$ row at the component area, and a second display element group comprising a set of auxiliary display elements that is located in an n+1th row at the component area, n being a positive integer;
the plurality of pixel circuit groups comprises a first pixel circuit group that is connected to the first display element group, and a second pixel circuit group that is connected to the second display element group; and
the first pixel circuit group is farther from the component area than the second pixel circuit group.

12. The display panel of claim 1, further comprising a plurality of data connection wirings configured to connect main data lines that are adjacent to the component area from among the plurality of main data lines to the plurality of auxiliary data lines, respectively,
wherein the plurality of data connection wirings is located at the main display area, and bypass the component area.

13. The display panel of claim 12, wherein each of the plurality of data connection wirings has a shape that is bent at least one time.

14. The display panel of claim 1, further comprising:
a plurality of gate driving circuits at a side portion of the peripheral area, and connected to the plurality of main gate lines, respectively; and
a plurality of gate connection wirings connected to gate driving circuits from among the plurality of gate driving circuits that are connected to main gate lines from among the plurality of main gate lines that are adjacent to the component area in the first direction.

15. The display panel of claim 14, wherein the plurality of main gate lines extends from the plurality of gate driving circuits, respectively, to the main display area, and
wherein the plurality of gate connection wirings extends from the plurality of gate driving circuits, respectively, to the peripheral area.

16. The display panel of claim 1, further comprising a plurality of electrode connection wirings configured to connect the plurality of auxiliary display elements to the plurality of auxiliary pixel circuits, respectively,
wherein the plurality of electrode connection wirings comprises a first electrode connection wiring and a second electrode connection wiring including different materials from each other.

17. The display panel of claim 16, wherein the first electrode connection wiring and the second electrode connection wiring are located at a same layer as each other, and
wherein an end of the second electrode connection wiring covers an end of the first electrode connection wiring.

18. The display panel of claim 1, wherein a distance between adjacent auxiliary display elements from among the plurality of auxiliary display elements is constant.

19. The display panel of claim 1, further comprising a plurality of main display elements at the main display area, and connected to the plurality of main pixel circuits, respectively, wherein an emission area of a main display element from among the plurality of main display elements that is configured to emit light of a first color is smaller than an emission area of an auxiliary display element from among the plurality of auxiliary display elements that is configured to emit light of the first color.

20. A display apparatus comprising:
a display panel comprising:
  a display area comprising a main display area, and a component area; and
  a peripheral area outside the display area; and
a component under the display panel to correspond to the component area,
wherein the display panel further comprises:
  a substrate;
  a plurality of main pixel circuits at the main display area;
  a plurality of main gate lines extending in a first direction, and connected to main pixel circuits that are located in a same row as each other from among the plurality of main pixel circuits;
  a plurality of main data lines extending in a second direction crossing the first direction, and connected to main pixel circuits that are located in a same column as each other from among the plurality of main pixel circuits;
  a plurality of auxiliary display elements at the component area along the first direction and the second direction;
  a plurality of auxiliary pixel circuits at the peripheral area adjacent to the main display area in a same row as each other, and connected to the plurality of auxiliary display elements, respectively;
  a plurality of auxiliary gate lines connected to the plurality of auxiliary pixel circuits, respectively, and to main gate lines from among the plurality of main gate lines that are adjacent to the component area in the first direction; and
  a plurality of auxiliary data lines connected to the plurality of auxiliary pixel circuits, respectively, and to main data lines from among the plurality of main data lines that are adjacent to the component area in the second direction.

21. The display apparatus of claim 20, wherein:
the plurality of auxiliary pixel circuits is divided into a plurality of pixel circuit groups;
the plurality of auxiliary display elements is divided into a plurality of display element groups that is connected to the plurality of pixel circuit groups, respectively; and
each of the plurality of display element groups comprises a set of auxiliary display elements from among the plurality of auxiliary display elements that is located in a same column or a same row as each other.

22. The display apparatus of claim 21, wherein:
each of the plurality of display element groups comprises a set of auxiliary display elements from among the plurality of auxiliary display elements that is located in the same column as each other;
auxiliary data lines from among the plurality of auxiliary data lines that are connected to a same pixel circuit group as each other are connected to one another; and
auxiliary gate lines from among the plurality of auxiliary gate lines that are connected to different pixel circuit groups from each other are connected to one another.

23. The display apparatus of claim 21, wherein:
each of the plurality of display element groups comprises a set of auxiliary display elements from among the plurality of auxiliary display elements that is located in the same row as each other;
auxiliary data lines from among the plurality of auxiliary data lines that are connected to different pixel circuit groups from each other are connected to one another; and
auxiliary gate lines from among the plurality of auxiliary gate lines that are connected to a same pixel circuit group as each other are connected to one another.

24. The display apparatus of claim 20, further comprising a plurality of electrode connection wirings configured to connect the plurality of auxiliary display elements to the plurality of auxiliary pixel circuits, respectively,
wherein the plurality of electrode connection wirings comprises a first electrode connection wiring, and a second electrode connection wiring that include different materials from each other.

25. The display apparatus of claim 24, wherein the second electrode connection wiring overlaps with the component area, and comprises a transparent conductive oxide.

* * * * *